United States Patent [19]
Itakura et al.

[11] Patent Number: 5,162,670
[45] Date of Patent: Nov. 10, 1992

[54] SAMPLE-AND-HOLD CIRCUIT DEVICE

[75] Inventors: Tetsuro Itakura, Fujisawa; Takeshi Shima, Sagamihara, both of Japan

[73] Assignee: Kabushiki Kaisha Toshiba, Kawasaki, Japan

[21] Appl. No.: 636,427

[22] Filed: Dec. 28, 1990

[30] Foreign Application Priority Data

Jan. 26, 1990 [JP] Japan .................................. 2-17299

[51] Int. Cl.⁵ .......................................... H03K 5/159
[52] U.S. Cl. ..................................... 307/353; 307/352
[58] Field of Search ............................... 307/352, 353

[56] References Cited

U.S. PATENT DOCUMENTS

| | | | |
|---|---|---|---|
| 3,862,437 | 1/1975 | Rossell | 307/352 |
| 4,363,976 | 12/1982 | Minor | 307/353 |
| 4,467,227 | 8/1984 | Lewyn et al. | 307/353 |
| 4,584,559 | 4/1986 | Penney | 307/352 |
| 4,634,993 | 1/1987 | Koen | 307/353 |
| 4,806,790 | 2/1989 | Sone | 307/353 |
| 4,987,323 | 1/1991 | Fujita | 307/353 |

FOREIGN PATENT DOCUMENTS

| | | |
|---|---|---|
| 0020160 | 12/1980 | European Pat. Off. ............ 307/352 |
| 114475 | 12/1983 | European Pat. Off. . |
| 60-59389 | 4/1985 | Japan . |
| 1-144299 | 6/1989 | Japan . |

OTHER PUBLICATIONS

"Clock-Feedthrough Compensated Sample/Hold Circuits", vol. 24, No. 19, Electronics Letters, Sep. 15, 1988, pp. 1226-1228, Watanabe et al.

Instruments and Experimental Techniques, vol. 26, No. 6, Nov. 1983, New York, US, pp. 1319-1321, Precision Integrating Sampling-Storage Device.

Electronic Design, vol. 26, No. 23, Nov. 1978, Hasbrouck Heights, N.J., pp. 84-89, Designing with a Sample-Hold Won't be a Problem if You Use the Right Circuit.

Primary Examiner—Eugene R. LaRoche
Assistant Examiner—Evelyn A. Lester
Attorney, Agent, or Firm—Oblon, Spivak, McClelland, Maier & Neustadt

[57] ABSTRACT

A sample-and-hold circuit includes a first switch element which is opened or closed in accordance with a first control signal so as to selectively connect an input signal terminal for receiving an input signal to an internal terminal, a non-linear element for connecting the internal terminal to an output terminal, a potential holding circuit connected between the output terminal and ground, and a second switch element or a current source circuit which is controlled by a second control signal so as to selectively connect the output terminal to ground.

7 Claims, 31 Drawing Sheets

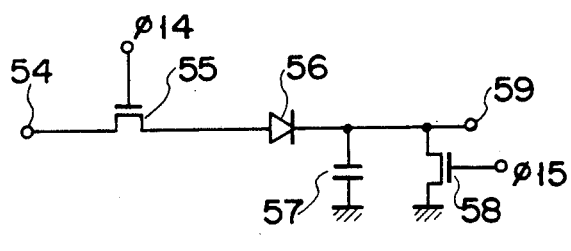
F I G. 1
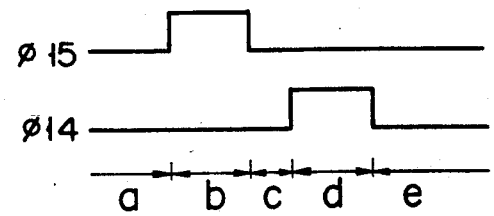
F I G. 2
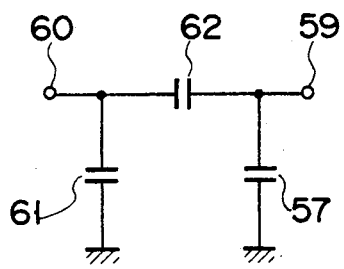
F I G. 3
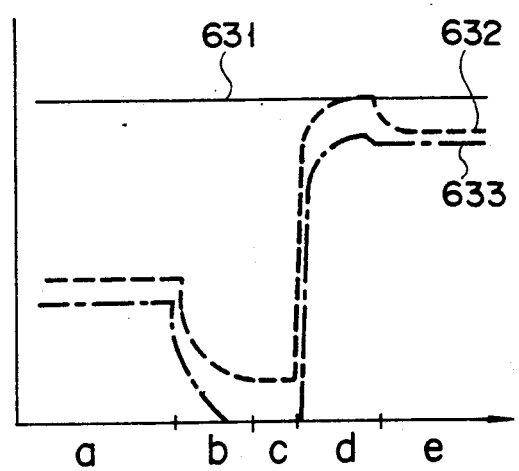
F I G. 4
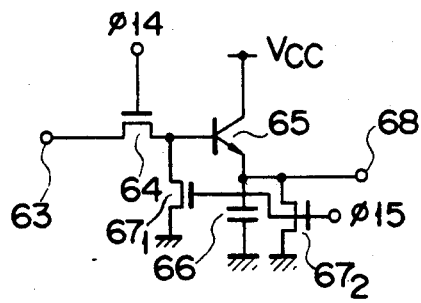
F I G. 5
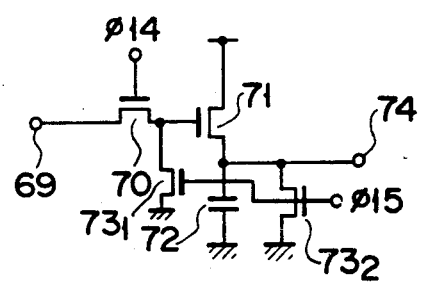
F I G. 6

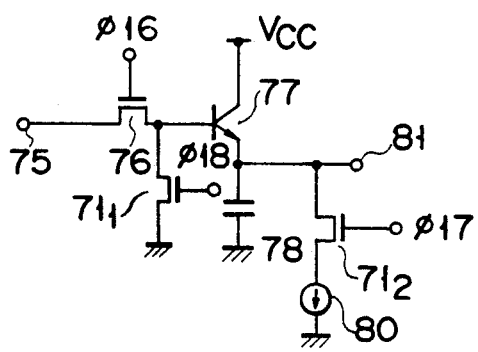
F I G. 7
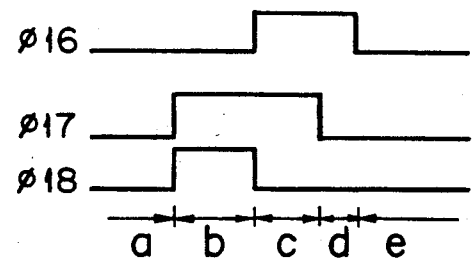
F I G. 8
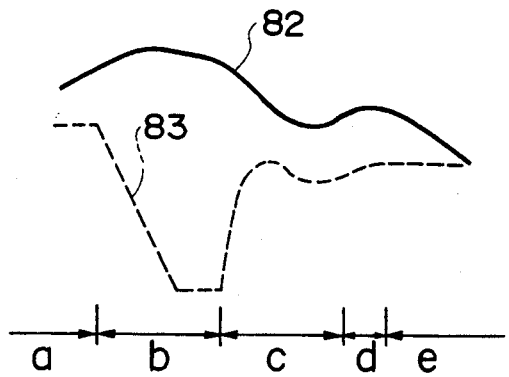
F I G. 9
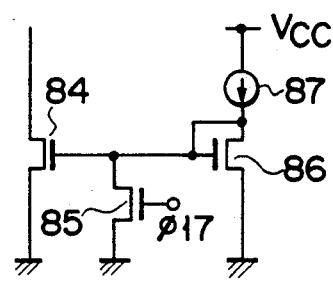
F I G. 10
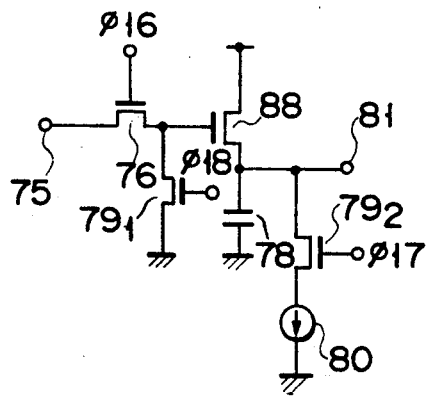
F I G. 11
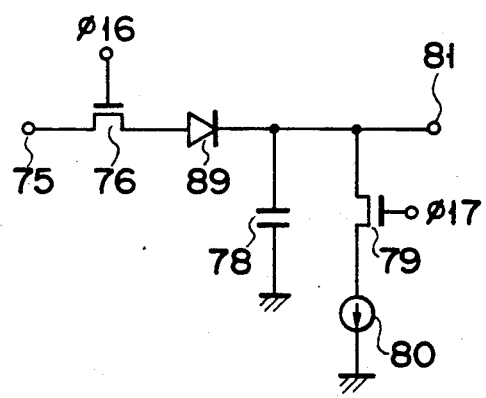
F I G. 12

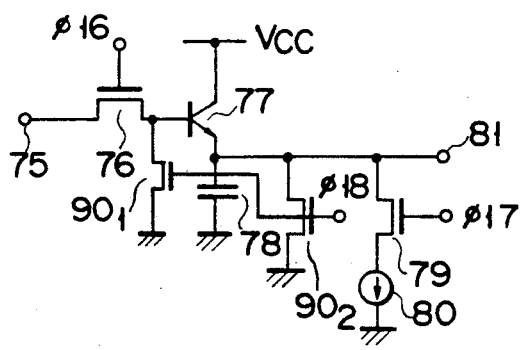
F I G. 13
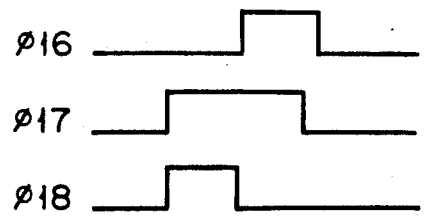
F I G. 14
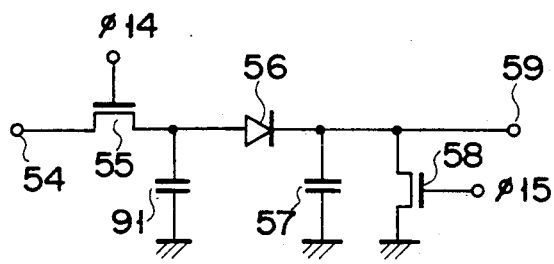
F I G. 15
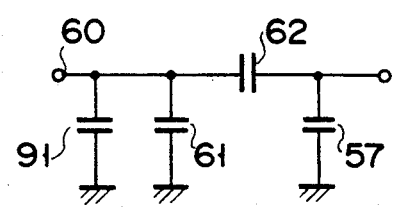
F I G. 16
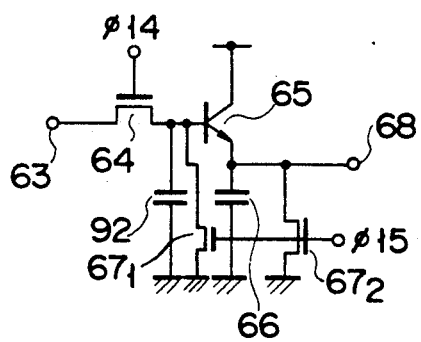
F I G. 17
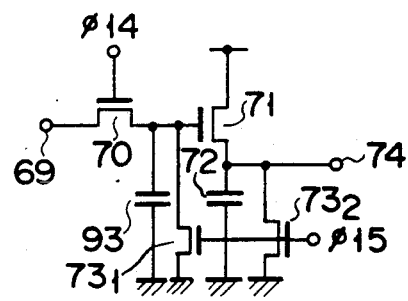
F I G. 18
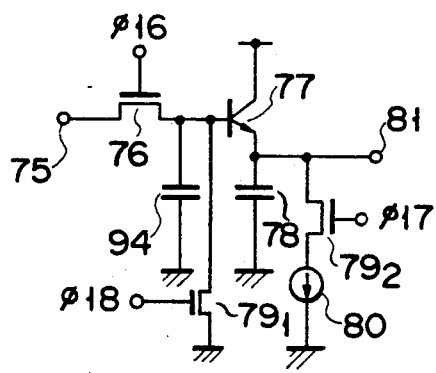
F I G. 19
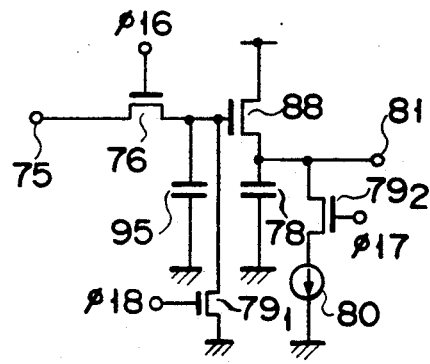
F I G. 20

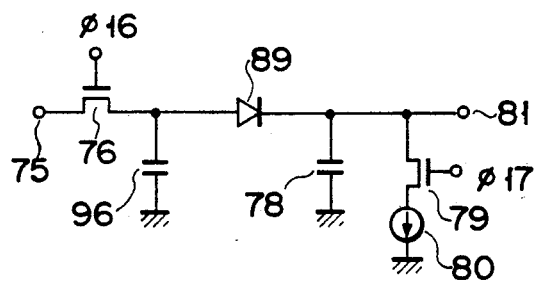
FIG. 21
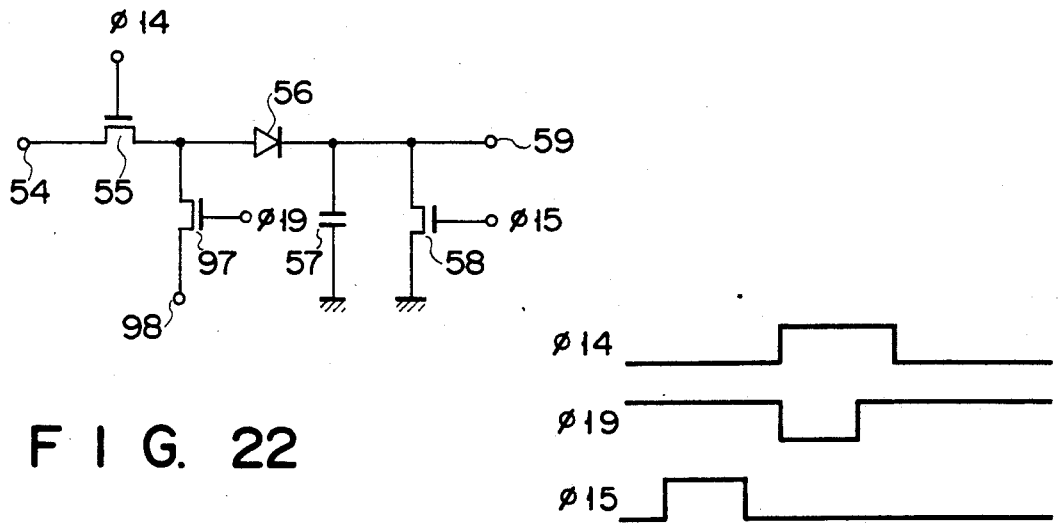
FIG. 22
FIG. 23
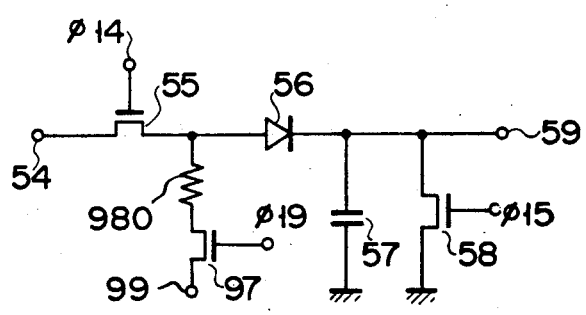
FIG. 24

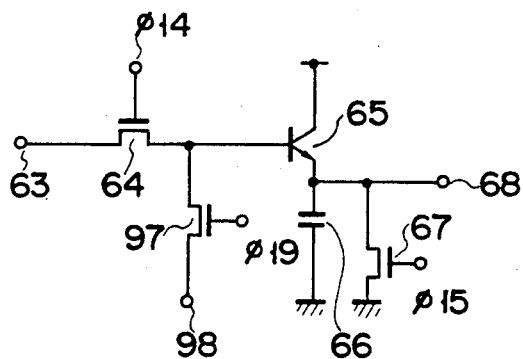
F I G. 25
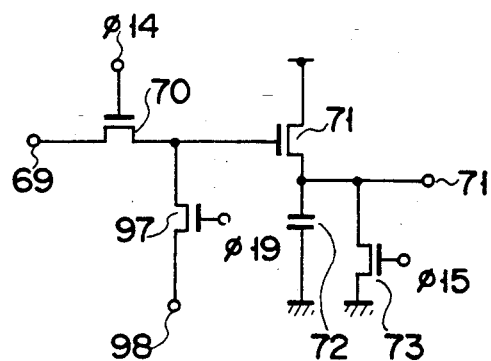
F I G. 26
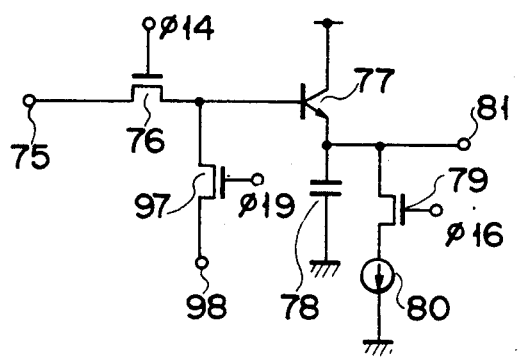
F I G. 27
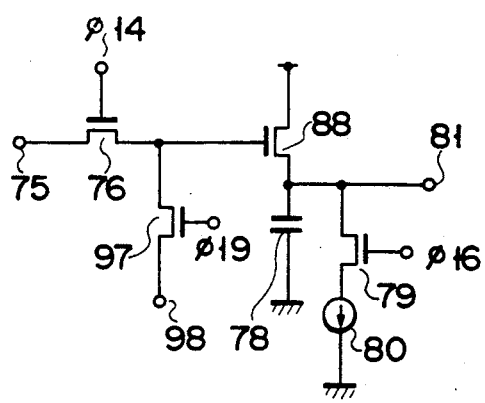
F I G. 28
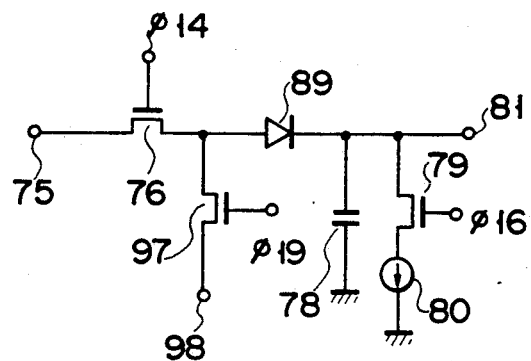
F I G. 29

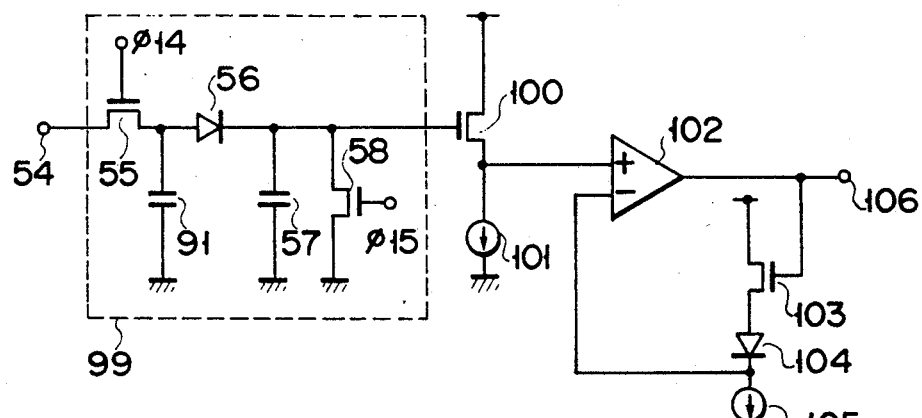
F I G. 30
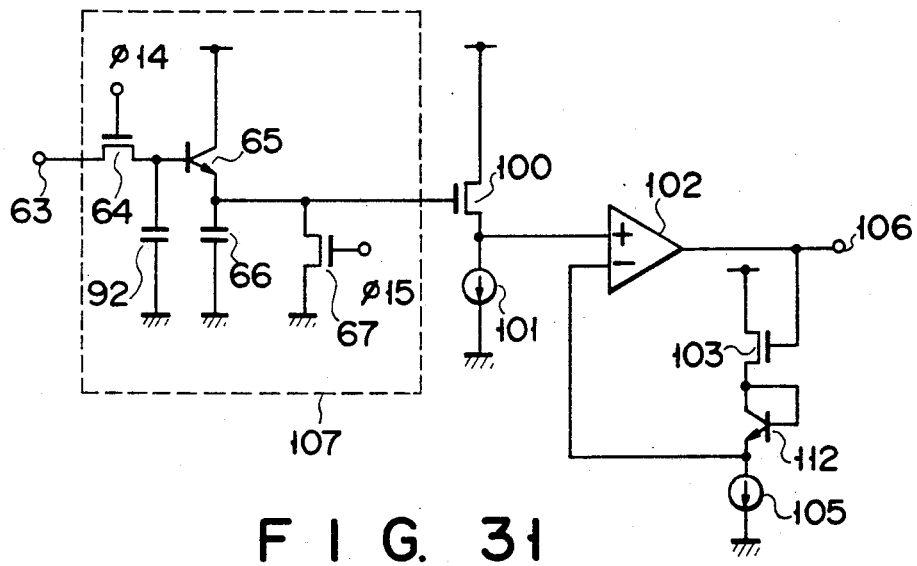
F I G. 31
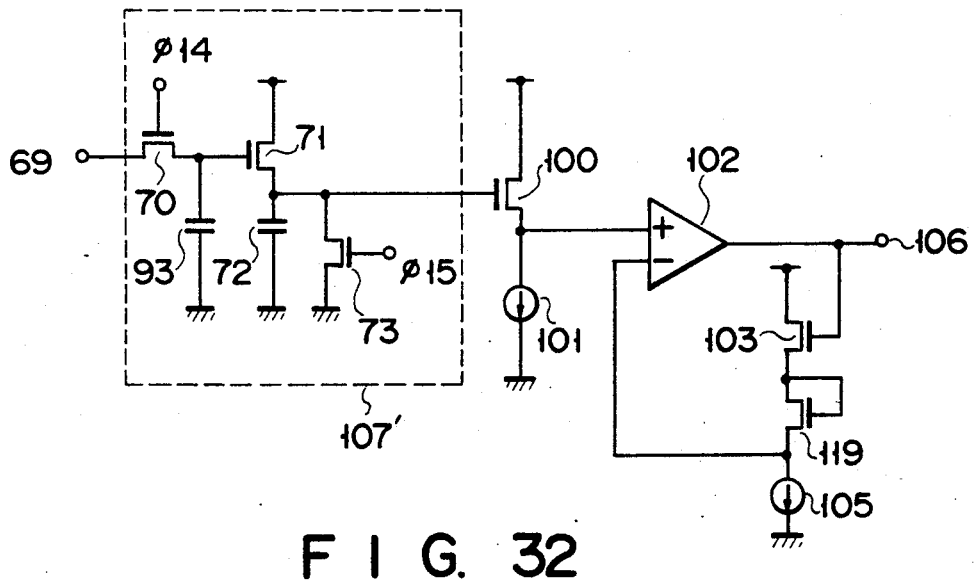
F I G. 32

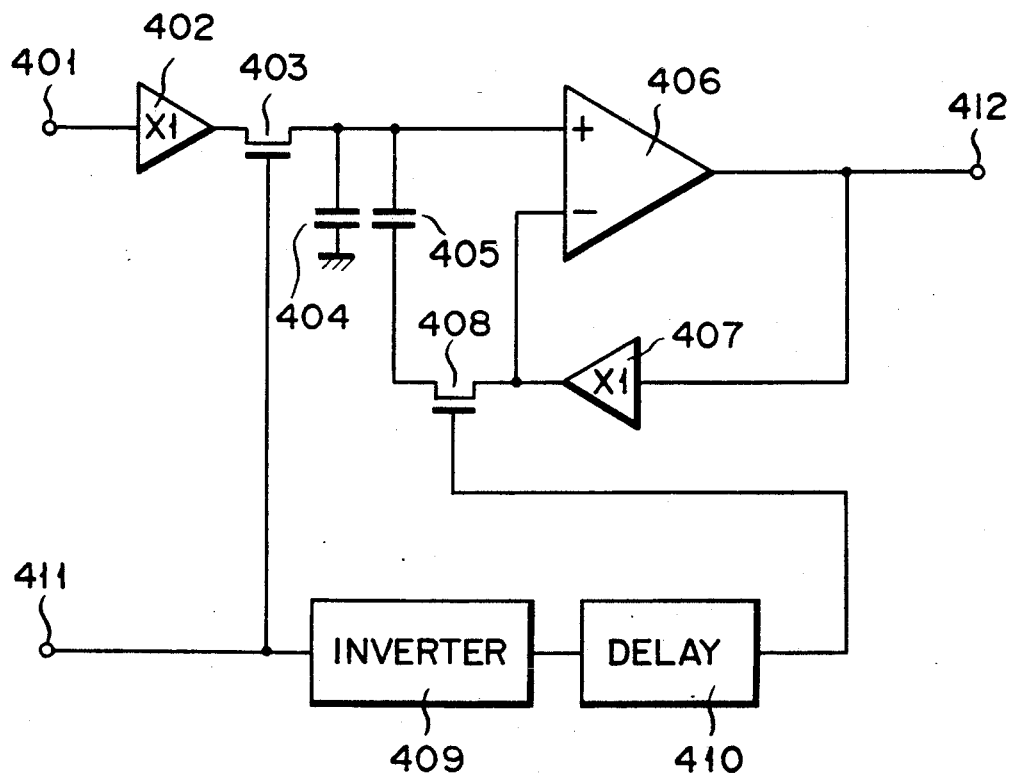
F I G. 37

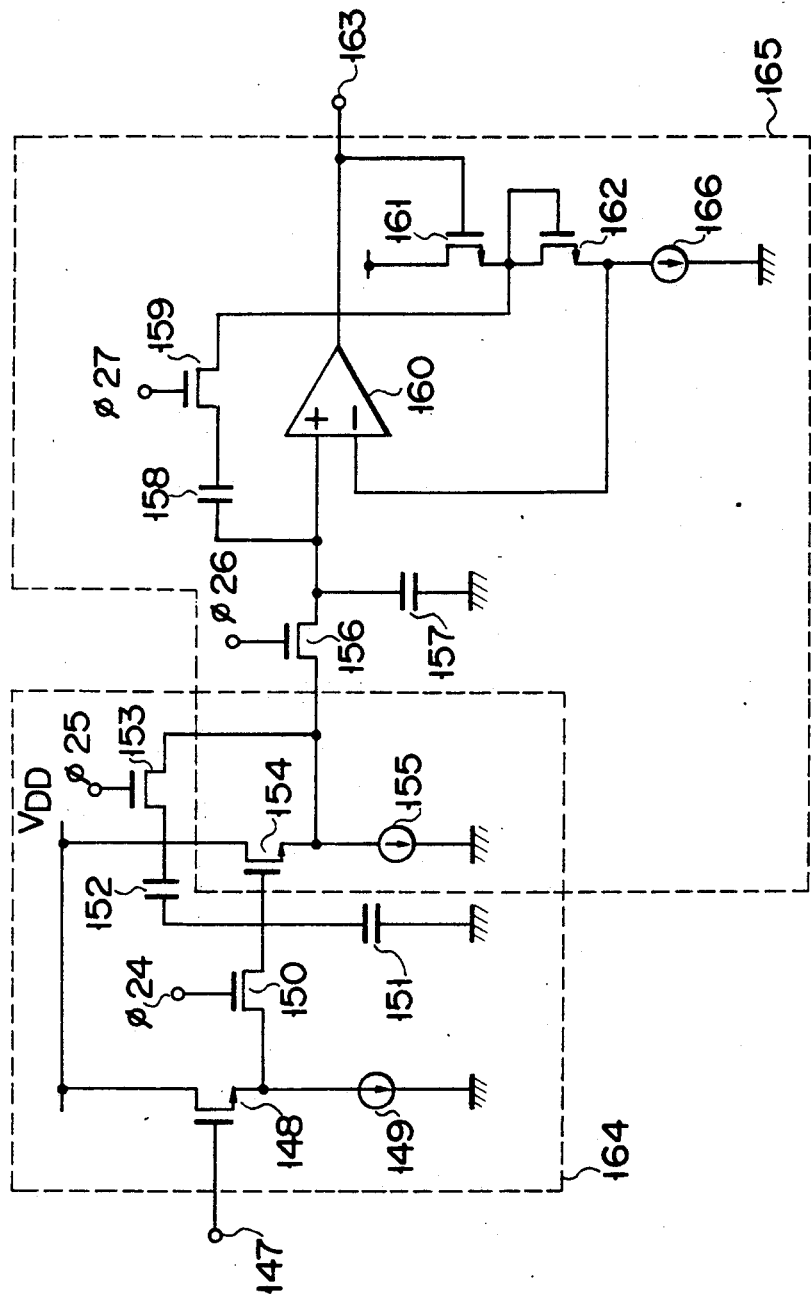
F I G. 38

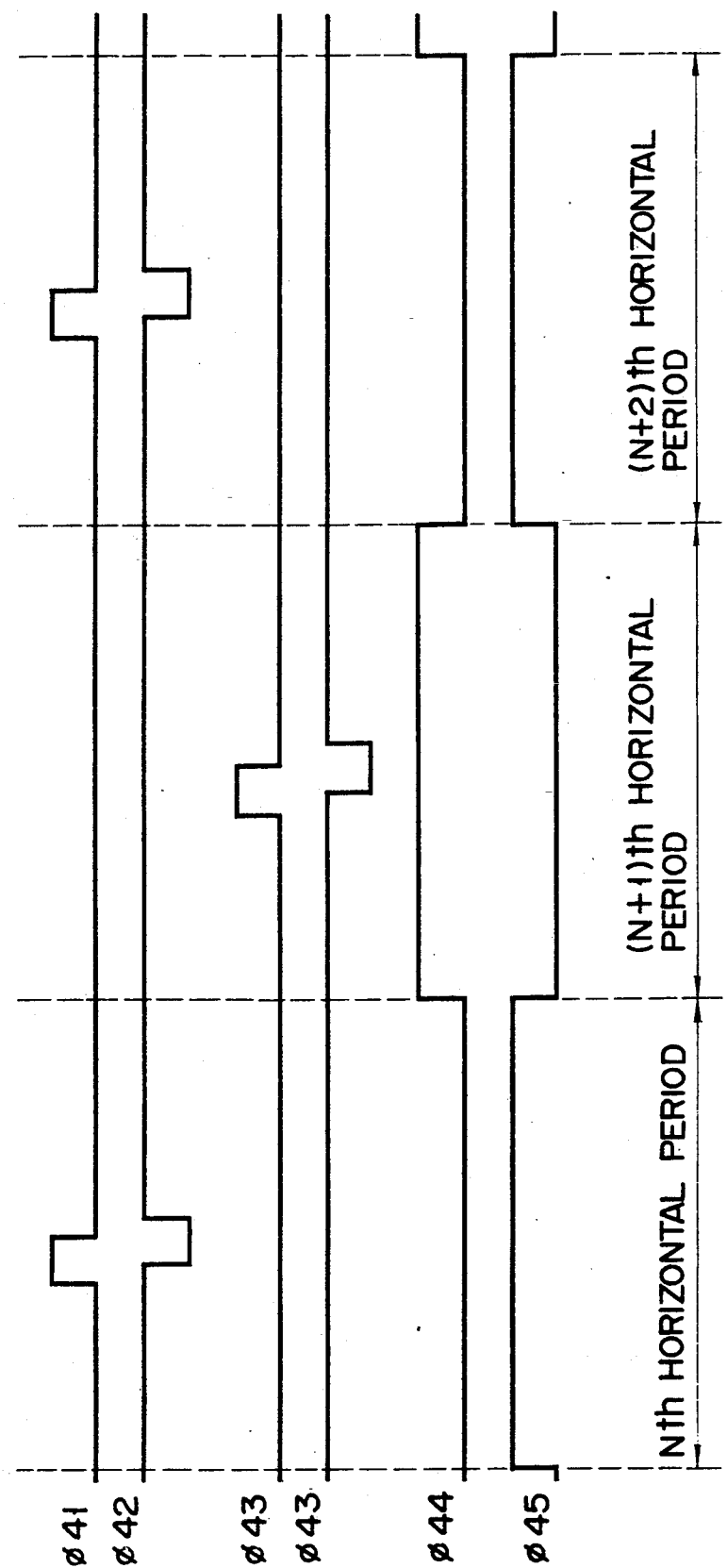
F I G. 47

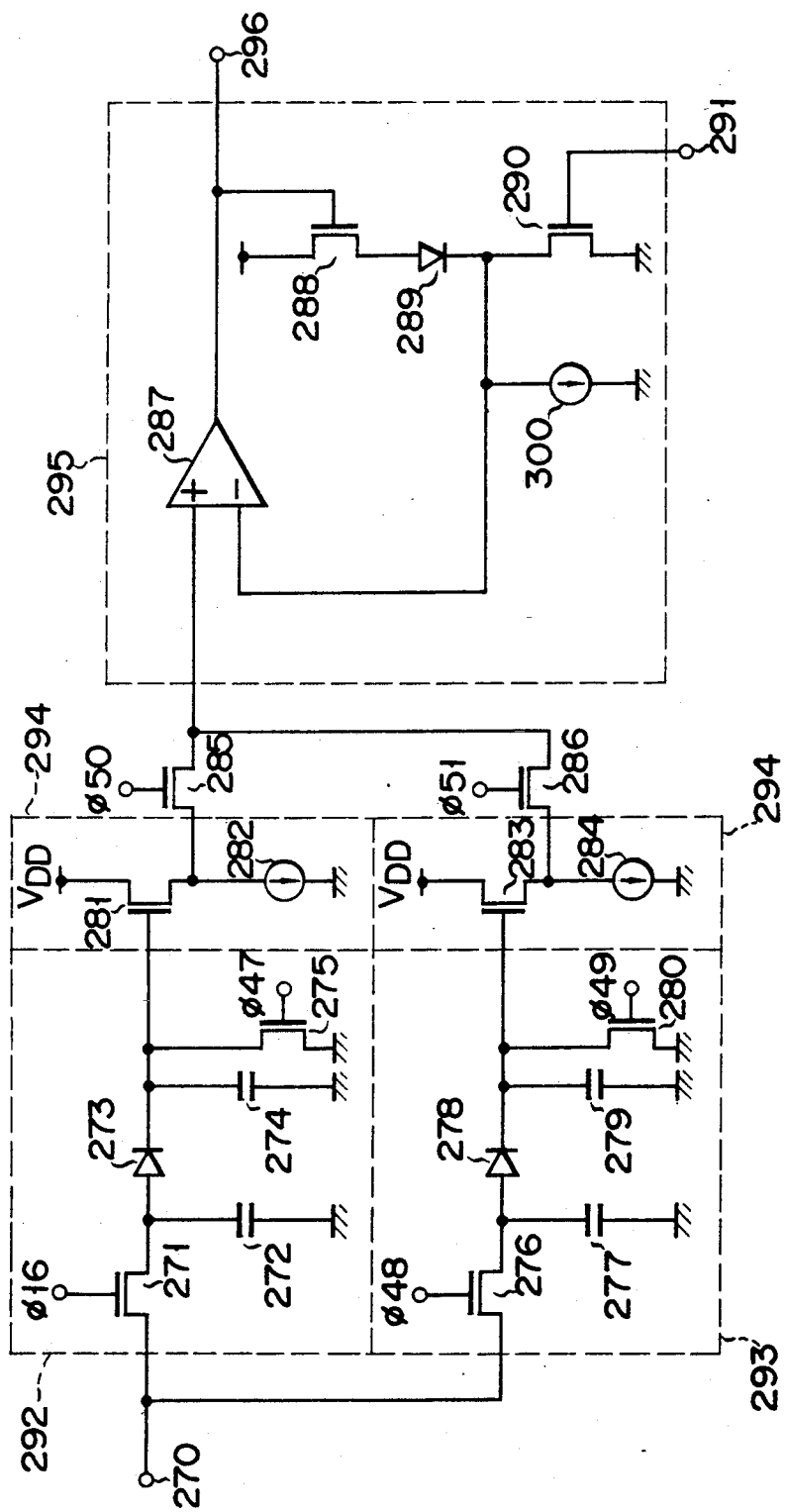
F I G. 51

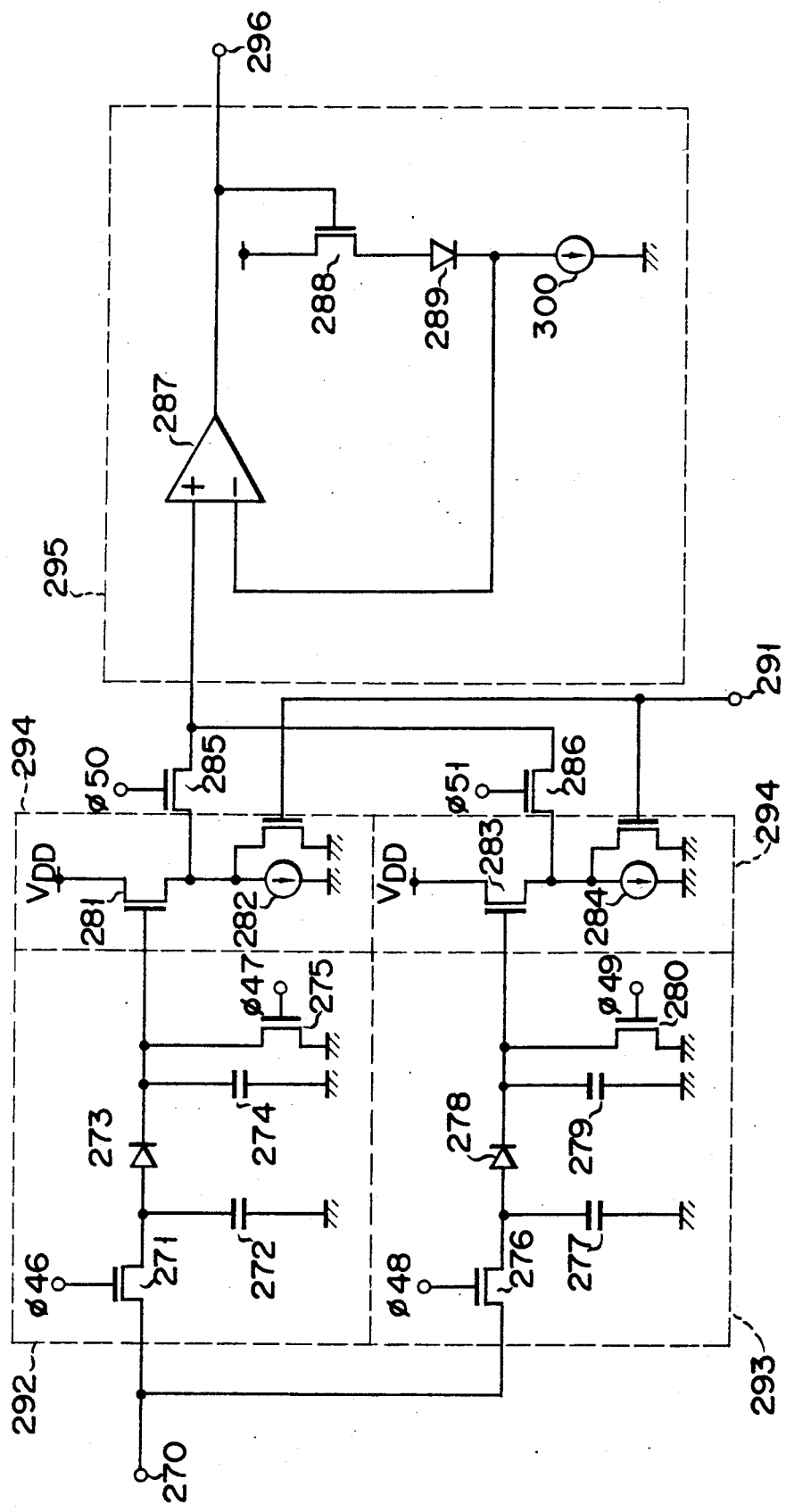
F I G. 52

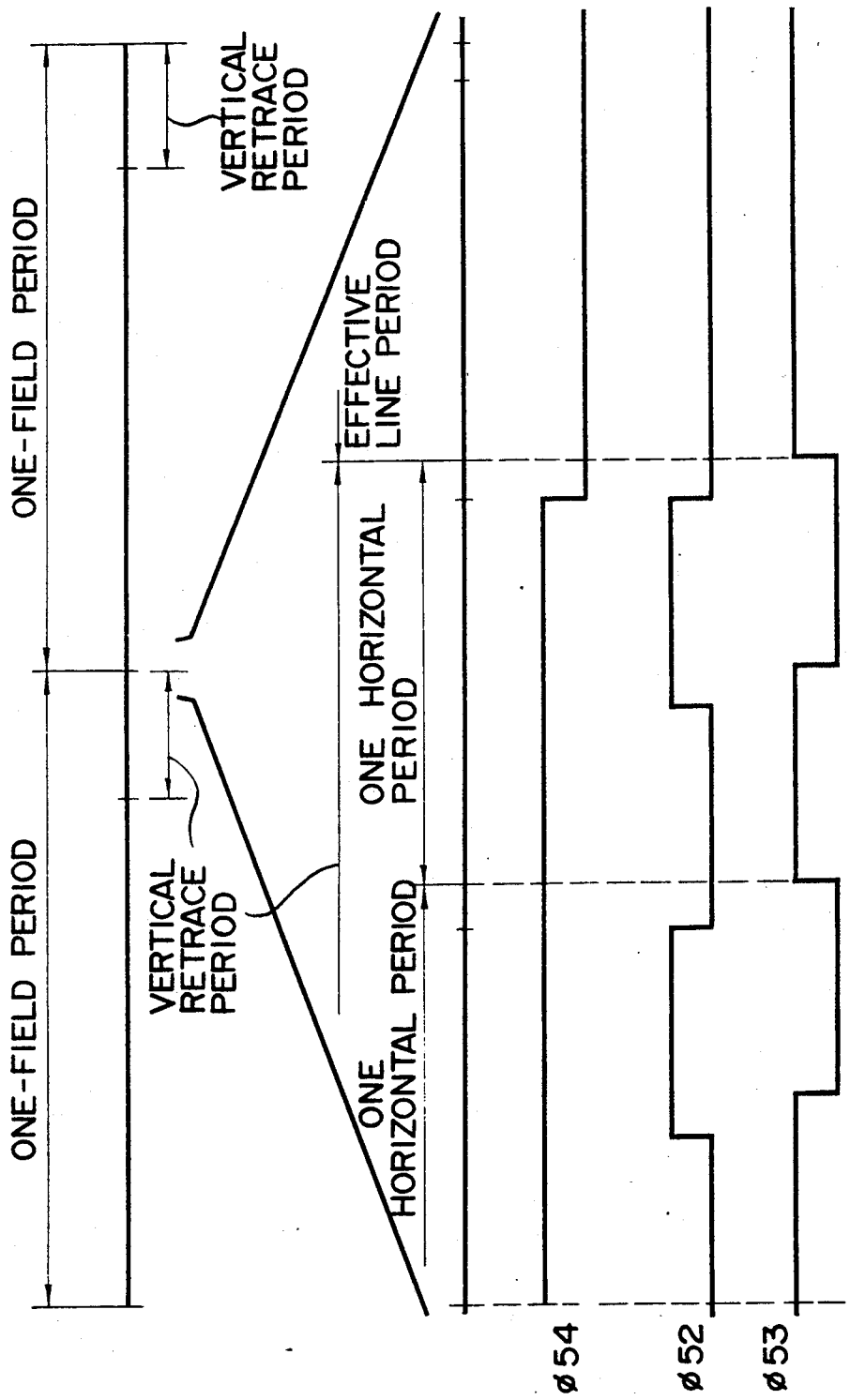
F I G. 54A

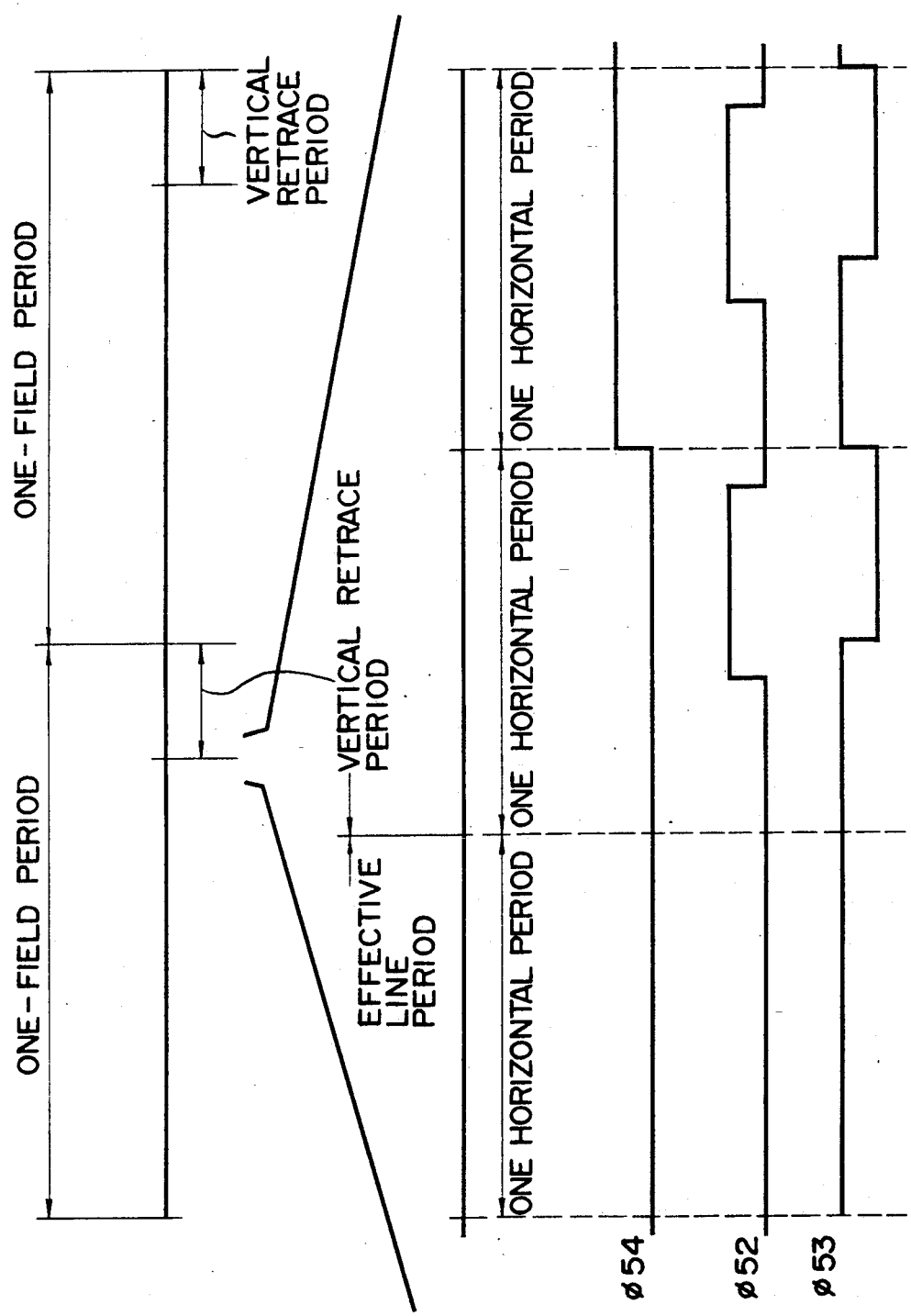
F I G. 54B

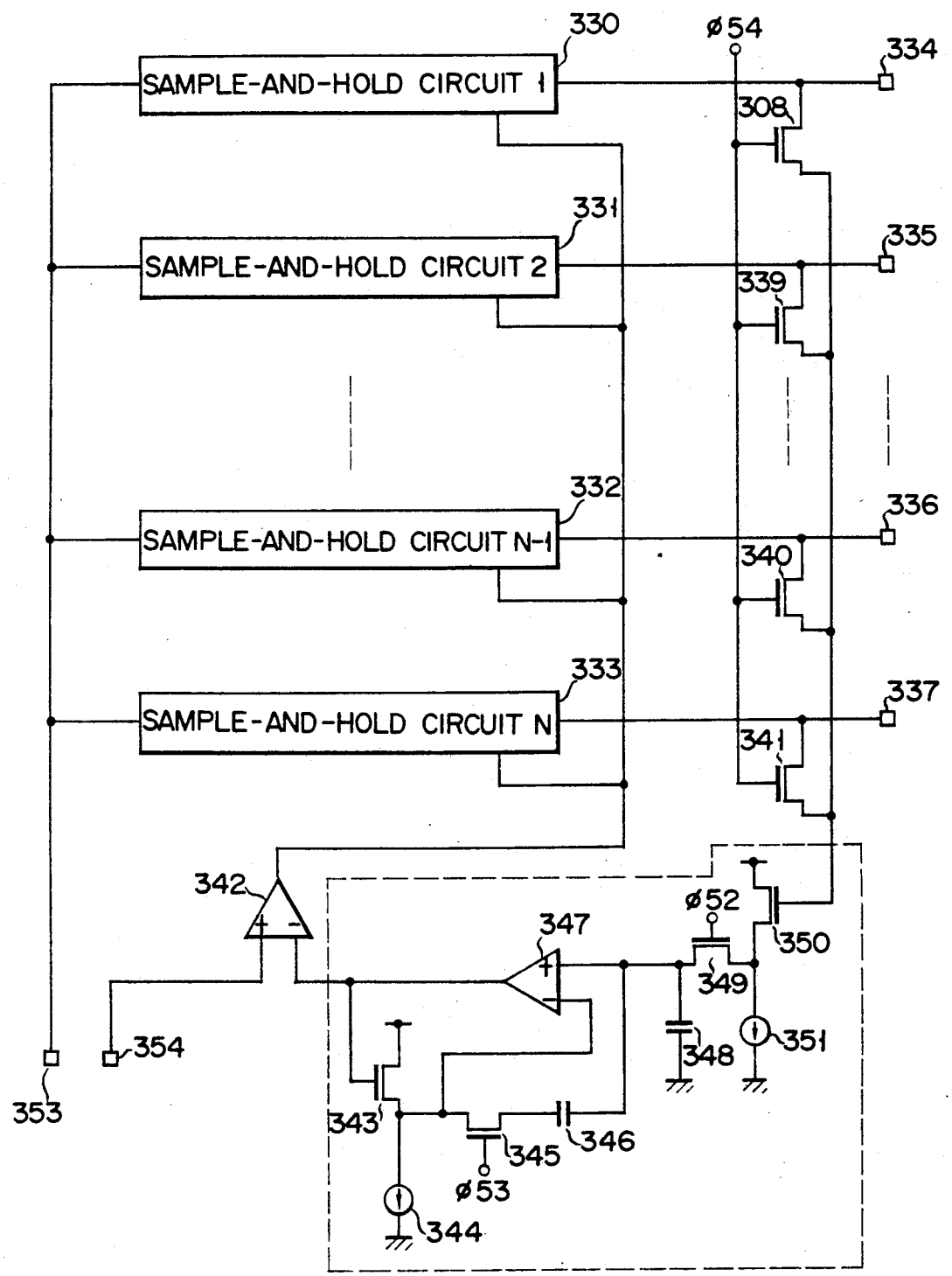
F I G. 55

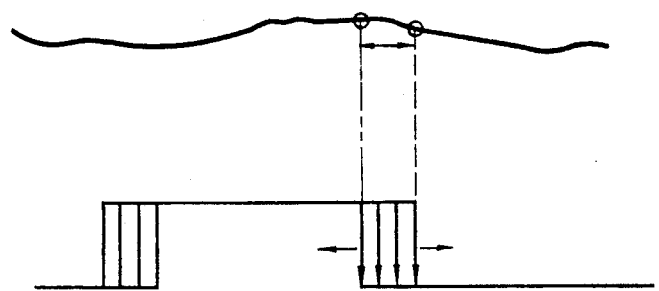
F I G. 57A
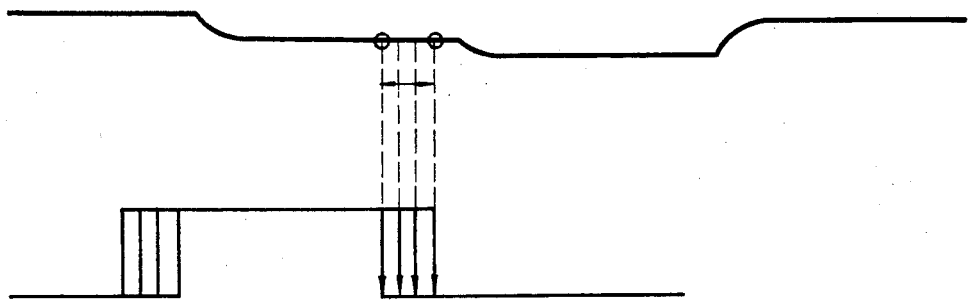
F I G. 57B

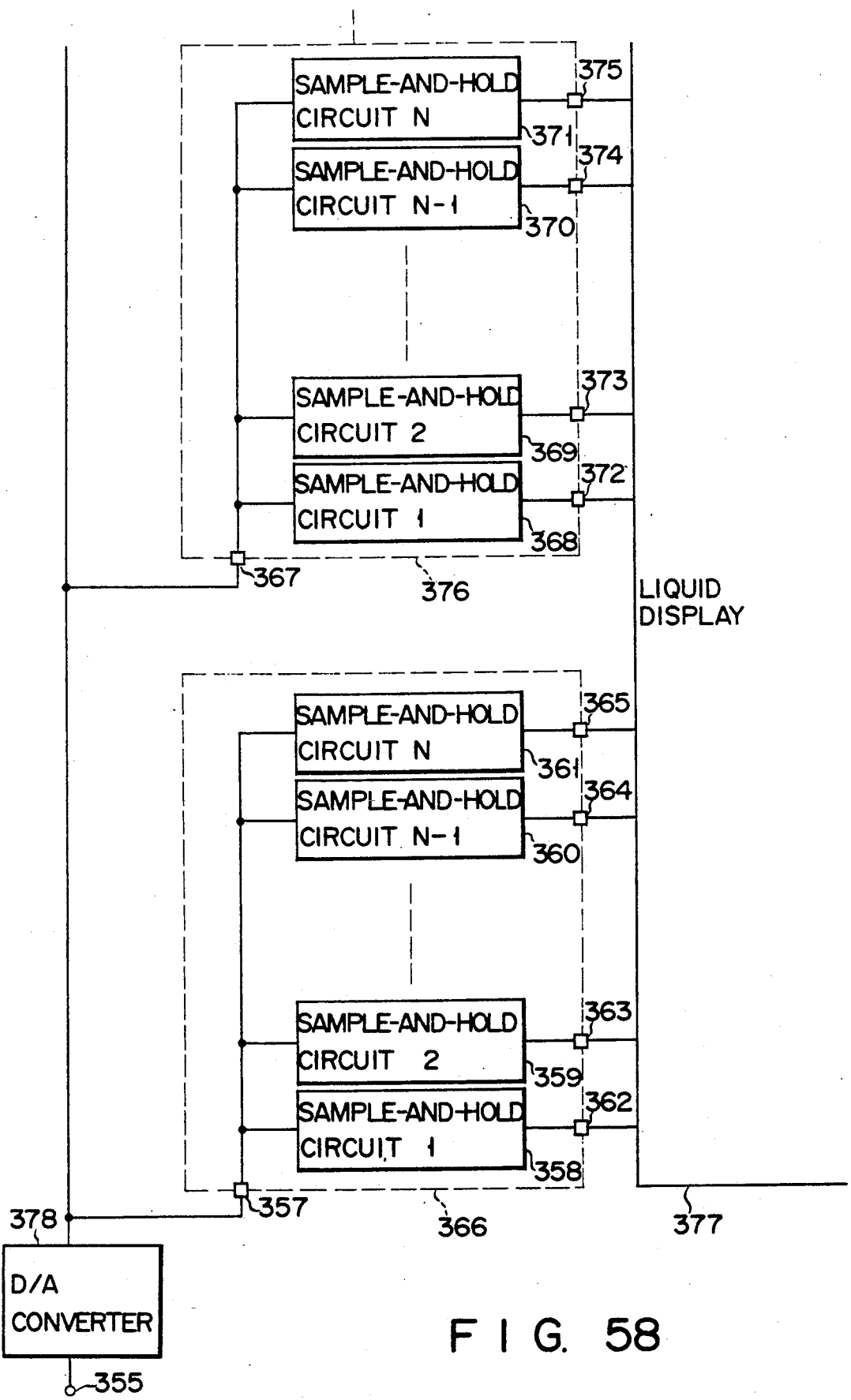
F I G. 58

SAMPLE-AND-HOLD CIRCUIT DEVICE

BACKGROUND OF THE INVENTION

1. Field of the Invention

The present invention relates to a high-precision sample-and-hold circuit device for driving a liquid crystal display or the like.

2. Description of the Related Art

According to a conventional sample-and-hold circuit device, a p-channel MOS transistor and an n-channel MOS transistor are connected in parallel with each other to constitute a MOS analog switch with one connection node being connected to an input terminal, and the other connection node being connected to a capacitor and an output terminal.

In the conventional sample-and-hold circuit device, control signals $\phi 1$ and $\phi 2$ having opposite phases are supplied to the gates of the parallel-connected MOS transistors to control an opening/closing operation of the MOS analog switch. When the MOS analog switch is set in a closed state by the control signals $\phi 1$ and $\phi 2$, charges are accumulated in the capacitor until the terminal potential of the capacitor reaches an input terminal potential. When the MOS analog switch is opened by the control signals $\phi 1$ and $\phi 2$, the charges accumulated in the capacitor are held. Such an operation is called a sample-and hold operation.

In the above sample-and-hold operation, if the sampling rate is increased, it is difficult that the conventional sample-and-hold circuit performs an ideal sample-and-hold operation. The reasons for this will be described below.

Stray capacitance called overlap capacitances are present between the gate electrode and the drain electrode and between the gate electrode and the source electrode of the MOS transistors. When the MOS switch is changed from a closed state to an open state by the control signals $\phi 1$ and $\phi 2$, the control signals leak from the gate electrodes into the capacitor through the overlap capacitor. The leaking signals serve as error charges and are superposed on the charges held in the capacitor. In addition, according to an operation principle of a MOS transistor, channel charges are generated in the channels of the two MOS transistors during an ON state. When each MOS transistor goes to an OFF state at a very low speed, the channel charge flows in the one of the source and drain electrodes which has a lower impedance. In contrast to this, if each MOS transistor goes to an OFF state at a high speed, the channel charge branches and flows in both the source and drain electrodes. Therefore, if sampling rate is increased, a given percent of channel charges are superposed, as error charges, on the charges held in the capacitor.

A sample-and-hold circuit is applied to a driving circuit used for a liquid crystal display or the like. In this case, the above-described sample-and-hold circuit is connected to an input terminal, and an output buffer having an output enable terminal is connected to the sample-and-hold circuit. The output terminal of the output buffer is connected to a liquid crystal cell through a switch using a TFT (Thin Film Transistor). Note that a wiring capacitance on the liquid crystal display is formed between the nodes of the output buffer and the TFT.

According to the above-mentioned liquid crystal display driving circuit, the sample-and-hold circuit samples/holds a video signal by using the control signals $\phi 1$ and $\phi 2$ in a horizontal period of the video signal in which an effective video signal is sent (to be referred to as an effective period hereinafter). At this time, the output buffer is set in an OFF state by a control signal OE, and its output terminal is set in an high-impedance state. In a horizontal blanking period after a sample and-hold operation is performed, the wiring capacitance is charged to a sampled/held potential by a control signal OE. In addition, the liquid crystal cell is driven through the TFT which is set in ON state by a control signal Yc. Since the characteristics of the TFT are inferior to those of a normal MOS transistor, the TFT must be further kept in the ON state for a given interval A after the horizontal blanking period by using the control signal. When the output terminal of the buffer is set in an high-impedance state by the control signal OE, and the TFT is set in an ON state, the potential held in the wiring capacitance drives the liquid crystal cell through the TFT even in the interval A.

The conventional liquid crystal display driving circuit has the following drawback as well as errors and difference in characteristics among the sample-and-hold circuits. Since the wiring capacitance is energized by nothing in the liquid crystal display driving interval A, the driving circuit is susceptible to the influences of external noise, and deterioration in picture quality tends to occur. In order to eliminate such a drawback, a conventional sample-and-hold circuit may have a multistage arrangement. In a multistage sample-and-hold circuit, however, errors and differences in characteristics among the respective stages may be superposed on each other.

Furthermore, since all the sample and hold circuits corresponding to the number of pixels of one horizontal scanning line cannot be integrated into one IC, a large number of ICs incorporating a large number of sample-and-hold circuits are used to drive the display. In this case, considerable differences in brightness or color tone occur in the form of a strip at portions on the screen at which the respective ICs are driven, thus deteriorating the picture quality.

As described above, in the conventional technique, the first problem to be solved is associated with an error caused by leakage of control signals, supplied to the sample-and-hold circuit, to the output terminal, and an error caused by channel charges generated when the analog switch constituted by the MOS transistors is in an OFF state. Furthermore, in the IC incorporating a large number of sample-and-hold circuits applied to a driving circuit for driving a liquid crystal display or the like, difference in errors among the sample-and-hold circuits makes the picture quality further deteriorate. The second problem to be solved is associated with the drawback that with a sample-and-hold circuit having a single-stage arrangement, a TFT or a liquid crystal cell of a liquid crystal display can be driven in only a horizontal blanking period of one horizontal period, and hence external noise appears on the screen to deteriorate the picture quality. If a sample-and-hold circuit having a two-stage arrangement is used to prevent such a problem, output attenuation or variation is undesirably increased. In addition to the problems in ICs, the third problem to be solved must be considered, which is associated with the drawback that differences in brightness or color tone occur in the form of a strip at portions on the screen driven by the respective ICs, due to difference in characteristics among the ICs, so as to considerably deteriorate the picture quality.

SUMMARY OF THE INVENTION

It is an object of the present invention to provide a sample-and-hold circuit device which decreases error and variation of an output signal.

It is another object of the present invention to provide a sample-and-hold circuit device which can drive a liquid crystal display for an arbitrary period within one horizontal period, which is longer than a horizontal blanking period without causing an increase in error and difference in characteristics among sample-and-hold circuits.

It is still another object of the present invention to provide a sample-and-hold circuit device which compensates for difference in characteristics among ICs.

According to the present invention, there is provided a sample-and-hold circuit device wherein an input signal terminal for receiving an input signal is connected to a first internal terminal through a first switch which is opened/closed in accordance with a first control signal, the first internal terminal is connected to a first output terminal through a first non-linear element, the first output terminal is connected to ground through a first potential holding circuit, and the first output terminal is connected to ground through a second switch controlled by a second control signal and/or through a first current source circuit.

The first switch is used to sample a signal. The first non-linear element and the first potential holding circuit are used to detect and hold a maximum or minimum potential when the first switch is set in a closed state. The second switch and/or the first current source circuit is used to initialize the first potential holding circuit.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 1 is a circuit diagram showing a sample-and-hold circuit device according to an embodiment of the present invention;

FIG. 2 is a timing chart of control signals used for the sample-and-hold circuit device in FIG. 1;

FIG. 3 is a circuit diagram for explaining the sample-and-hold circuit device in FIG. 1;

FIG. 4 is a graph for explaining an operation of the sample-and-hold circuit device in FIG. 1;

FIGS. 5 and 6 are circuit diagrams each showing a sample-and-hold circuit device obtained by using a non-linear element different from that of the sample-and-hold circuit device in FIG. 1;

FIG. 7 is a circuit diagram showing a sample-and-hold circuit device according to another embodiment of the present invention;

FIG. 8 is a timing chart of control signals used for the sample-and-hold circuit device in FIG. 7;

FIG. 9 is a graph for explaining an operation of the sample-and-hold circuit device in FIG. 7;

FIG. 10 is a circuit diagram showing a sample-and-hold circuit device, obtained by arranging a current source capable of being controlled by control signals in the sample-and-hold circuit device in FIG. 7, according to still another embodiment of the present invention;

FIGS. 11 and 12 are circuit diagrams each showing a sample-and-hold circuit device, obtained by using a non-linear element different from that of the sample-and-hold circuit device in FIG. 7, according to still another embodiment of the present invention;

FIG. 13 is a circuit diagram showing a sample-and-hold circuit device obtained by combining the circuits in FIGS. 5 and 7 together;

FIG. 14 is a timing chart of control signals used for the sample-and-hold circuit device in FIG. 13;

FIG. 15 is a circuit diagram showing a sample-and-hold circuit device whose characteristics are further improved as compared with the sample-and-hold circuit device in FIG. 1;

FIG. 16 is a circuit diagram for explaining the sample-and-hold circuit device in FIG. 15;

FIGS. 17 and 18 are circuit diagrams each showing a sample-and-hold circuit device obtained by using a non-linear element different from that of the sample-and-hold circuit device in FIG. 15;

FIGS. 19, 20, and 21 are circuit diagrams respectively showing sample-and-hold circuit devices whose characteristics are further improved as compared with the sample-and-hold circuit devices in FIG. 7, 11, and 12;

FIG. 22 is a circuit diagram showing a sample-and-hold circuit device according to still another embodiment of the present invention;

FIG. 23 is a timing chart of control signals used for the sample-and-hold circuit device in FIG. 22;

FIG. 24 is a circuit diagram showing a sample-and-hold circuit device obtaining by inserting a current-limiting resistor in the sample-and-hold circuit device in FIG. 22;

FIGS. 25 and 26 are circuit diagrams each showing a sample-and-hold circuit device obtained by using a non-linear element different from that of the sample-and-hold circuit device in FIG. 22;

FIGS. 27, 28, and 29 are circuit diagrams respectively showing sample and-hold circuit devices obtained by using current sources controlled by control signals in place of initialization switches in FIGS. 22, 25, and 26;

FIGS. 30, 31, and 32 are circuit diagrams respectively showing sample-and-hold circuit devices obtained by adding DC offset compensation circuits to the embodiments shown in FIGS. 15, 17, and 18;

FIG. 37 is a circuit diagram showing a sample-and-hold circuit according to still another embodiment;

FIG. 38 is a circuit diagram showing a sample-and-hold circuit device for outputting a sampled/held value for one horizontal period;

FIG. 47 is a timing chart of control signals used for the sample-and-hold circuit device in FIG. 46;

FIG. 51 is a circuit diagram showing a sample-and-hold circuit used for the circuit in FIG. 51;

FIG. 52 is a circuit diagram showing another sample-and-hold circuit used for the circuit in FIG. 50;

FIGS. 54A and 54B are timing charts of control signals used for the sample-and-hold circuit in FIG. 53;

FIG. 55 is a circuit diagram showing still another DC offset compensation circuit between ICs in correspondence with FIG. 53;

FIGS. 57A and 57B are graphs, showing the waveforms of signals, for explaining an operation of the circuit device in FIG. 56; and FIG. 58 is a circuit diagram showing a circuit device, corresponding to the circuit device in FIG. 56, which receives a digital signal and uses a D/A converter.

DETAILED DESCRIPTION OF THE PREFERRED EMBODIMENTS

Figure 34:
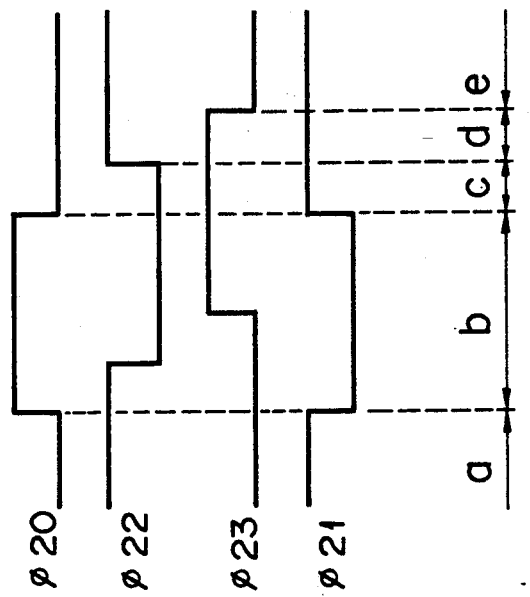
FIG. 34 is a timing chart of control signals used for the sample-and-hold circuit device in FIG. 33.

An embodiment of the present invention which is designed to solve the first problem will be described in detail below with reference to FIG. 1.

An input terminal 54 is connected to a capacitor 57, an n-channel MOS transistor 58, and an output terminal 59 through an n-channel MOS transistor 55 and a Schottky diode 56.

In the above circuit, control signals $\phi 14$ and $\phi 15$ shown in FIG. 2 are supplied to the gates of the MOS transistors 55 and 58. The MOS transistor 58 is turned on by the control signal $\phi 15$ to set the two terminals of the capacitor 57 to the same potential. That is, the capacitor is initialized. Thereafter, the MOS transistor 55 is turned on by the control signal $\phi 14$. At this time, the capacitor 57 is charged through the diode 56 so as to be set to a potential equal to a value obtained by subtracting a value corresponding to a forward voltage drop of the diode 56 from the potential of an input signal. When the control signal $\phi 14$ is changed from high level to low level, and the MOS transistor 55 is turned off, the charge of the control signal $\phi 14$ leaking through an overlap capacitance of the MOS transistor 55 and part of a channel charge of the MOS transistor 55 tend to flow, as error charges $\Delta Q$, into the capacitor 57 through the diode 56. However, since these error charges are negative, the diode 56 is reverse-biased, and only a Schottky junction serves as a path through which charges can flow into the capacitor 57. This state will be described below with reference to FIG. 3.

According to a circuit in FIG. 3, a terminal 60 serves as an anode terminal of the Schottky diode in which error charges flow; a capacitor 61, as a junction capacitor Cj between the source (or drain) of the transistor 55 and a bulk substrate; and a capacitor 62, as a Schottky junction capacitor Cs. Error charges flowing from the terminal 60 are distributed to the capacitor (Cj) 61 side and the capacitors 62 side. If the capacitor 57 is represented by a capacitance Ch, error charges corresponding to $(\Delta Q \cdot Cs/(Cs+Cj))$ flow into the capacitors 57 and 62, since Ch >> Cs. At this time, an error voltage generated in the capacitor 57 is represented by $(\Delta Q \cdot Cs)/[(Cs+Cj) \cdot Ch]$. That is, the error voltage can be decreased from an error voltage $\Delta Q/Ch$ generated in the conventional technique at a rate of $Cs/(Cs+Cj)$. FIG. 4 shows this state.

Referring to FIG. 4, time intervals a, b, c, and d respectively correspond to time intervals a, b, c, and d in FIG. 2. A characteristic $63_1$ represents an input signal to the input terminal 54; a characteristic $63_2$, the potential of the anode terminal of the diode 56 in FIG. 1; and a characteristic $63_3$, the output potential of the output terminal 59. In the time interval a, a previously sampled value is held. In the time interval b, the transistor 58 is turned on by the control signal $\phi 15$, and its output potential is initialized. The potential of the anode terminal of the diode is higher than the output potential by an amount corresponding to a forward voltage drop of the diode. In the time interval d, the transistor 55 is turned on by the control signal $\phi 14$ to set a sample mode. In addition, the anode terminal of the diode 56 is set to an input potential, and the output potential becomes lower than the input potential by an amount corresponding to a forward voltage drop. In the time interval e, although an error voltage appears at the anode terminal of the diode due to error charges generated when the transistor 55 is turned off, almost no error voltage appears at the output terminal.

It is described hereinbefore that when MOS transistor 55 is turned off, the anode potential of the Schottky diode drops down, and thus the diode 56 is turned off. However, since the diode 56 is reverse-biased, the diode having a low withstand reverse-bias voltage, for example, Schottky diode may be broken down. In order to prevent the diode from the breakdown, a single diode or a series circuit of a plurality of diodes may be connected in parallel to the diode.

In the above-described embodiment, a Schottky diode is used as a non-linear element. However, the same effects as those described above can be obtained by using a bipolar transistor 65 shown in FIG. 5 or a MOS transistor 71 shown in FIG. 6 as a non-linear element. More specifically, in FIG. 5, an input terminal 63 is connected to the base of the bipolar transistor 65 through an n-channel MOS transistor 64, and the emitter of the bipolar transistor 65 is connected to a capacitor 66, an n-channel MOS transistor $67_2$, and an output terminal 68. In FIG. 6, an input terminal 69 is connected to the gate of a MOS transistor 71 through an n-channel MOS transistor 70, and the source of the MOS transistor 71 is connected to a capacitor 72, an n-channel MOS transistor $73_2$, and an output terminal 74.

In FIG. 5, the base potential of the transistor 65 is initialized by the MOS transistor $67_1$ controlled by the control signal $\phi15$ so that the excess current does not flow from the collector of the transistor 65 into the emitter when the output voltage is initialized. Similarly, in FIG. 6, the gate potential of the MOS transistor 71 is initialized by the MOS transistor $73_1$ controlled by the controlled signal $\phi15$ so that the excess current does not flow from the drain of the MOS transistor 71 into the source thereof when the output potential is intialized.

FIG. 7 shows an embodiment wherein a current source is used to initialize the potential of a capacitor. The base potential of the bipolar transistor is reset similarly to the embodiment of FIG. 5. In this embodiment, an input terminal 75 is connected to the base of a bipolar transistor 77 through a MOS transistor 76. The collector of the bipolar transistor 77 is coupled to a voltage Vcc. The emitter of the transistor 77 is connected to a capacitor 78, the drain of a MOS transistor $71_2$, and an output terminal 81. The source of the MOS transistor $71_2$ is connected to a current source 80. The drain and source of a MOS transistor $71_1$ are connected to the base of the bipolar transistor 77 and the ground, and the gate is supplied with a control signal $\phi18$. Control signals $\phi16$ and $\phi17$ are respectively supplied to the gates of the MOS transistors 76 and $71_2$. FIG. 8 is a timing chart of these signals $\phi16$, $\phi17$ and $\phi18$.

FIG. 9 shows an input signal 82 and an output signal 83. Referring to FIG. 9, time intervals a, b, c, d, and e respectively correspond to time intervals a, b, c, d, and e in FIG. 8. In the time interval a, a potential which is lower than the potential of a previously sampled input signal by Vbe of the transistor 77 is held in the capacitor 78. In the time interval b, the base potential of the bipolar transistor 77 has a ground potential in response to the control signal $\phi18$ whereby the transistor 77 is turned off, and the current source 80 is connected to the output terminal 81 by the MOS transistor $71_2$ turned on by the control signal $\phi17$, and the potential of the capacitor 78 is initialized, as indicated by the output signal 83 in FIG. 9. In the time interval c, the transistor 76 is turned on by the control signal $\phi16$, and the transistor 77 forms an emitter follower so as to charge the capacitor 78 to a potential lower than the potential of the input signal by Vbe of the transistor 77. The potential at the output terminal side of the capacitor 78 continuously follows to a potential constantly lower than the potential of the input signal by Vbe of the transistor 77 until the time interval is shifted to the time interval d. In the time interval d, while the potential of the input signal is changed to higher values, the potential at the output terminal side of the capacitor 78 follows to the potential lower than the potential of the input signal by Vbe of the transistor 77. However, when the potential of the input signal is changed to lower values, since the transistor 77 is turned off, the capacitor holds the potential before the change. In the time interval e, since the base potential of the transistor 77 becomes lower than a potential, set immediately before the transistor 76 is turned off, due to error charges generated when the transistor 76 is turned off, the transistor 77 is turned off, and the output potential is held. In the circuit shown in FIG. 7, the current source controlled by the control signal $\phi17$ is constituted by the current source 80 and the transistor $71_2$. As shown in FIG. 10, this current source may be constituted by a current source 87, a current mirror circuit formed of transistors 84 and 86, and a transistor 85 for controlling the current mirror circuit by using a control signal $\phi17$.

FIG. 7 shows the case wherein the bipolar transistor is used as a non-linear element. The same effects as those described above can be obtained by using a MOS transistor 88 shown in FIG. 11 or a diode 89 shown in FIG. 12 as a non-linear element. In addition, the discharge interval of a capacitor 78 can be shortened by adding a MOS transistor, controlled by a control signal $\phi18$, to the circuit in FIG. 7, as shown in FIG. 13.

FIG. 15 shows an embodiment wherein an auxiliary capacitor (Ca) 91 is connected to the node between the MOS transistor 55 and the diode 56 in the circuit shown in FIG. 1. As described with reference to FIG. 1, in the circuit shown in FIG. 1, the error voltage can be decreased from the conventional error voltage at a rate of Cs/(Cs+Cj). In this case, since the capacitor (Cj) 61 is dependent on the size of a transistor, the effect of the present invention may be reduced with a small transistor. If an auxiliary capacitor 91 is connected in parallel with a capacitor (Cj) 61 as indicated by an equivalent circuit in FIG. 16, a reduction in effect of the present invention can be prevented. At this time, the error voltage is decreased from the conventional error voltage at a rate of Cs/(Cj+Cs+Ca). If Ca >> Cs and Cj and Ca are selected, the error voltage can be decreased from the conventional error voltage at a rate of Cs/Ca rearly equal to zero (~0). Such an arrangement can be applied to cases wherein bipolar transistors 65 and 77, and MOS transistors 71 and 88 are used as non-linear elements, and to the case wherein a current source 80 controlled by a control signal $\phi17$ is used as a discharge means for a capacitor 78, as shown in FIGS. 17 to 21. Note that these sample-and-hold circuit devices respectively include auxiliary capacitors 92, 93, 94, 95, and 96.

FIG. 22 shows a case wherein a MOS transistor 97 controlled by a control signal $\phi19$ is connected to the node between the MOS transistor 55 and the diode 56 in the circuit shown in FIG. 1. Control signals are supplied to MOS transistors 55, 97, and 58 of the circuit in FIG. 22 at timings shown in FIG. 23. More specifically, the transistor 97 is turned on by the control signal $\phi19$ before the transistor 55 is turned off by a control signal $\phi14$. At this time, error charges which are generated when the transistor 55 is turned off are coupled to and absorbed by an arbitrary potential point 98 through the transistor 97, thus preventing the error charges from flowing to the output terminal side. There is an interval in which the transistors 55 and 97 are simultaneously turned on by the control signals $\phi14$ and $\phi19$. In this interval, if the ON resistances of the transistors 55 and 97 are low, a large current flows and increases the power consumption. However, this can be prevented by inserting a resistor 99 in series with the transistor 97, as shown in FIG. 24. The method of adding the MOS transistor 97 controlled by the control signal $\phi 19$ can be applied to cases wherein a bipolar transistor 65 and a MOS transistor 71 are used as non-linear elements, as shown in FIGS. 25 and 26. In addition, the present invention can be applied to cases wherein a current source 80 controlled by a control signal $\phi 17$ is used as a discharge means for a capacitor, as shown in FIGS. 27 to 29.

FIGS. 30 to 32 show embodiments each including a means for compensating for a DC offset caused by a non-linear element. A description will be made below with reference to FIG. 30.

A sample-and-hold circuit 99 has the same circuit arrangement as that of the sample-and-hold circuit shown in FIG. 15. The output potential of this sample-and-hold circuit is equal to a potential obtained by subtracting a value corresponding to the forward voltage drop of a diode 56 from the input potential given at the input terminal 54 and this output potential is applied to a source follower constituted by a MOS transistor 100 and a current source 101. That is, the positive input terminal of an operational amplifier 102 has a potential lower than the output potential by an amount corresponding to a voltage drop in the gate-source path of the MOS transistor 100. An output from the operational amplifier 102 is fed back to the negative input terminal of the operational amplifier 102 through a MOS transistor 103 and a diode 104, thus constituting a voltage follower. Since this circuit is operated to equalize the positive and negative input terminal potentials of the operational amplifier 102, an output terminal 106 is set to a potential higher than the input potential of the operational amplifier 102 by an amount corresponding to a voltage drop in the gate-source path of the MOS transistor 103 and a forward voltage drop of the diode 104. If the forward voltage drop of the diode 56 is set to be equal to that of the diode 104, and the gate-source path potential of the MOS transistor 103 is set to be equal to that of the MOS transistor 100, the potential of the output terminal 106 becomes equal to the input potential. When such sample-and-hold circuits are to be integrated in large quantities into ICs, matching of the diodes 56 and 104 and of the MOS transistors 100 and 103 is performed by setting the respective elements to be adjacent each other on a pattern layout, thereby reducing difference in output characteristics among the respective sample-and-hold circuits to a value corresponding to matching precision of two non-linear elements of each sample-and-hold circuit which underwent matching.

FIG. 31 shows a sample-and-hold circuit 107 using a bipolar transistor 65 as a non-linear element, i.e., an embodiment employing the circuit shown in FIG. 17. A voltage follower circuit connected to the output terminal of the sample-and-hold circuit 107 has the same circuit arrangement as that of the circuit shown in FIG. 30 except that a diode-connected transistor 112 is used in place of the diode 104.

FIG. 32 shows a sample-and-hold circuit 107' using a MOS transistor 71 as a non-linear element, i.e., an embodiment employing the circuit shown in FIG. 18. A voltage follower circuit connected to the output terminal of the sample-and-hold circuit 107' has the same circuit arrangement as that of the circuit shown in FIG. 31 except that a diode-connected MOS transistor 119 is used in place of the diode 104.

According to the circuits shown in FIGS. 30 to 32, a DC offset caused by a non-linear element can be compensated and difference in characteristics among the sample-and-hold circuits can be reduced by inserting a level shift means, constituted by an element equivalent to the non-linear element, in the feedback path of a voltage follower.

In each embodiment described above, the power consumption is essentially based on charge and discharge operations of the capacitor and of the auxiliary capacitor, and errors and difference in characteristics can be reduced.

A second means for solving the first problem will be described below.

According to this means, there is provided a sample-and-hold circuit device wherein the drain (or source) of a first NMOS transistor and the drain (or source) of a first PMOS transistor are connected to an input signal terminal for receiving an input signal, the source (or drain) of the first NMOS transistor and the source (or drain) of the first PMOS transistor are connected to an output terminal, the output terminal and ground are connected to each other through a first potential holding circuit, a first control signal is applied to the gate of the first NMOS transistor, a signal, obtained by delaying an inverted signal of the first control signal by using a first delay circuit, is applied to the gate of the first PMOS transistor, both or either of the drain and source of a second PMOS transistor is connected to the output terminal, and a signal, obtained by delaying the first control signal by using a second delay circuit, is applied to the second PMOS transistor.

According to this sample-and-hold circuit device, the first PMOS transistor and the first NMOS transistor constitute an analog switch in which the first PMOS transistor is turned off later. The analog switch is used to sample an input signal. The first potential holding circuit serves to hold the potential of an input signal which is set when the first PMOS transistor is turned off. The second PMOS transistor is turned on after the first PMOS transistor is turned off. The second PMOS transistor is used to compensate for an error caused when the first PMOS transistor is turned off.

A means for solving the second problem will be described in detail below with reference to the FIG. 33.

Figure 33:
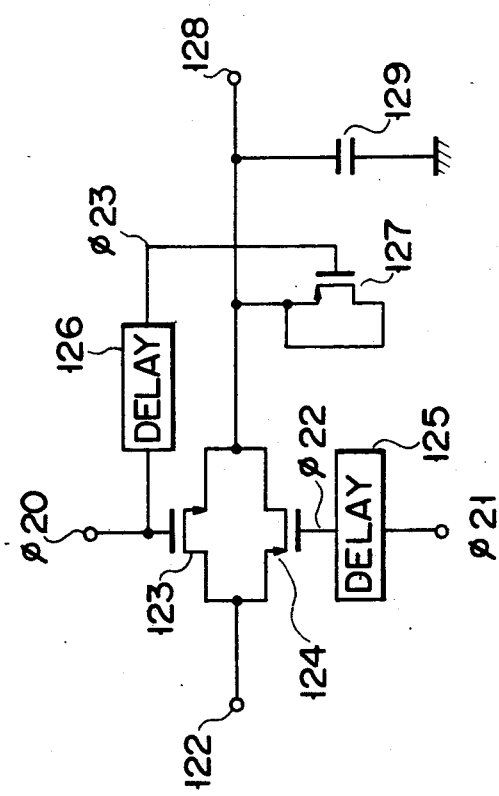
FIG. 33 is a circuit diagram showing a sample-and-hold circuit device according to still another embodiment of the present invention.

Referring to FIG. 33, an input terminal 122 is connected to the input terminal of a switch circuit constituted by a parallel circuit of an NMOS transistor 123 and a PMOS transistor 124. The output terminal of this switch circuit is connected to a PMOS transistor 127, a capacitor 129, and an output terminal 128. The gate of the PMOS transistor 127 is coupled to a control signal ($\phi 20$) terminal through a delay circuit 126. In addition, a delay circuit 125 is connected to the gate of the PMOS transistor 124.

The sample-and-hold circuit shown in FIG. 33 receives control signals shown in FIG. 34. Of these control signals, a control signal $\phi 20$ is a control signal to be input to the gate of the transistor 123 and is also used to control the transistor 127 through the delay circuit 126. A control signal $\phi 21$ controls the transistor 124 through the delay circuit 125.

In a time interval a in a timing chart shown in FIG. 34, the transistors 123 and 124 are OFF, and the transistor 127 is ON. In a time interval b, the NMOS transistor 123 is turned on first by the control signal 20. The PMOS transistor 124 is then turned on by a control signal φ22, and an input signal potential applied to the input terminal 122 is held in the capacitor 129. During the time interval b, the PMOS transistor 127 is turned off. Control signals leaking through channel charges or an overlap capacitance generated at this time are absorbed by signal sources biasing the input signal terminal 122 through the transistors 123 and 124, and hence have no influences on the potential held in the capacitor 129.

In a time interval c, the NMOS transistor 123 is turned off. Control signals leaking through channel charges or an overlap capacitance generated when the NMOS transistor is turned off are absorbed by a signal source biasing the input signal terminal 122 through the PMOS transistor 124, and hence have no influences on the potential held in the capacitor 129. In a time interval d, the PMOS transistor 124 is turned off. The influences of control signals leaking through channel charges or an overlap capacitance generated at this time are left in the capacitor as error charges. In a time interval e, the PMOS transistor 127 is turned on. Since control signals leaking through channel charges or an overlap capacitance generated at this time have a polarity opposite to that of the control signals generated when the transistor is turned off, the error charges left in the capacitor 129, which are generated when the PMOS transistor 124 is turned off, are canceled.

In the above-described embodiment, the order of ON/OFF operations of the respective transistors is controlled by control signals. That is, the order of ON/OFF operations of the NMOS and PMOS transistors constituting the analog switch does not depend on an input signal potential, unlike the conventional technique. Therefore, error charges can be canceled with high precision. In addition, the sample-and-hold circuit of the present invention is free from jitter components of control signals.

Figure 36A:
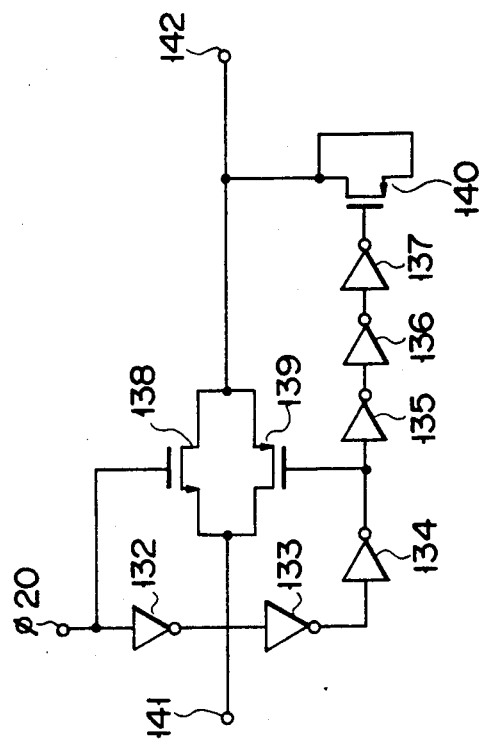
FIG. 36A is a circuit diagram showing a detailed arrangement of the sample-and-hold circuit device in FIG. 34.
Figure 35:
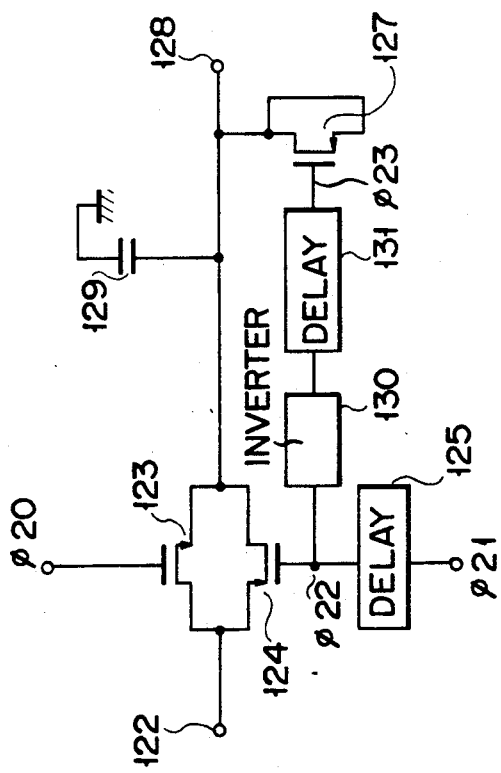
FIG. 35 is a circuit diagram showing a sample-and-hold circuit device obtained by using a timing circuit different from that of the embodiment in FIG. 33.
Figure 36B:
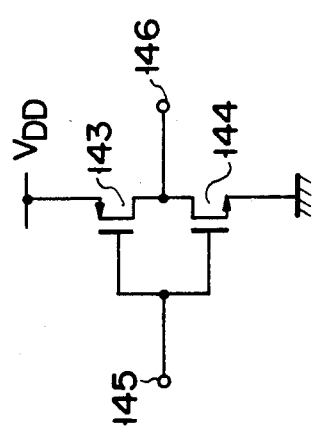
FIG. 36B is a circuit diagram showing an inverter arranged in the sample-and-hold circuit device in FIG. 36A.

As a control signal to be supplied to a compensating transistor 127, an inverted signal φ21 of a control signal φ20 may be supplied through a delay circuit 125, an inverter 130, and a delay circuit 131, as shown in FIG. 35. FIG. 36 shows a case wherein a plurality of inverters 132 to 137 are used. As shown in FIG. 37, each inverter is constituted by two series-connected MOS transistors 143 and 144 and is connected to a gate input terminal 145 for these transistors. The node of these transistors is connected to an output terminal. In the circuit shown in FIG. 36, each inverter is used as a delay circuit so that the delay time of each inverter is utilized.

A third means for solving the first problem will be described referring to FIG. 37.

According to the sample-and-hold circuit device, input terminal 401 is connected to the input terminal of a first buffer 402. The output terminal of the first buffer 402 is connected to the source (or drain) of a MOS transistor (first switch element) 403 which is turned on or off by a first control signal input from a control signal input terminal 411. A first capacitor 404 is connected between the drain (or source) of the MOS transistor 403 and the ground. An operational amplifier 406 has a non-inverting input terminal connected to the drain (or source) of the MOS transistor 403. A second buffer 407 is connected between the inverting input terminal and output terminal of the operational amplifier 406. The output terminal of the second buffer 407 is connected to the source (or drain) of a MOS transistor (second switch element) 408. A second capacitor 405 is connected between the drain (or source) of the MOS transistor 408 and the non-inverting input terminal of the operational amplifier 406. The gate of the MOS transistor 408 is connected to the control signal input terminal 411 and the gate of the MOS transistor 403 through a delay circuit 410 and an inverter 409 in series.

In this sample-and-hold circuit, if the output impedances of the first and second buffers are equal to each other, a ratio of error charges derived from the source of the MOS transistor 403 to those from the drain thereof when the MOS transistor 403 is turned off can be matched with that of error charges flowing into the source of the MOS transistor 408 to those into the drain thereof when the MOS transistor 408 is turned on. Due to this matching of the ratios, the sample-and-hold circuit can operate with higher accuracy than the above embodiments.

A first means for solving the first and second problems will be described below.

The first means is constituted by a first sample-and-hold circuit for sampling and holding an input signal, and a second sample-and-hold circuit, having a high input impedance, for further sampling and holding an output from the first sample-and-hold circuit.

According to the sample-and-hold circuit device for solving the first and second problems, a potential sampled and held by the first sample-and-hold circuit in an effective time interval within a horizontal period of an image is sampled and held in a horizontal blanking period without influencing a potential held by the second sample-and-hold circuit having the high input impedance.

The sample-and-hold circuit device for solving the above problems will be described in detail below with reference to FIG. 38.

According to the device, first and second sample-and-hold circuits 164 and 165 are arranged. An input terminal 147 is connected to the gate of an NMOS transistor 148 of the first sample-and-hold circuit 164. The source of the NMOS transistor 148 is connected to the source (drain) of an NMOS transistor 150. The drain (source) of the NMOS transistor 150 is connected to capacitors 151 and 152 and the gate of the NMOS transistor 154. The source of the NMOS transistor 154 is connected to the capacitor 152 through the source (drain) of an NMOS transistor 153 and is connected to a current source 155 and the source (drain) of an NMOS transistor 156 of the second sample-and-hold circuit 165.

The drain (source) of the NMOS transistor 156 is connected to capacitors 157 and 158 and the non-inverting input terminal of an operational amplifier 160. The output terminal of the operational amplifier 160 is connected to the gate of the NMOS transistor 161, and an output terminal 163. The source of the NMOS transistor is connected to the gate and the drain of the NMOS transistor 162 and the capacitor 158 through an NMOS transistor 159. The source of the NMOS transistor 162 is connected to a current source 166 and the non-inverting input terminal of an operational amplifier 160.

The first sample-and-hold circuit 164 is constituted by a first source follower formed of the transistor 148 and a current source 149 and arranged on the input side, and a second source follower formed of the transistor 154 and a current source 155. In this arrangement, the output impedances of the first and second source followers are set to be equal to each other, thus realizing a sample and-hold circuit with less error. The second sample-and-hold circuit 165 uses the second source follower as an input stage, and includes a third source follower formed of the current source 166 and the transistor 161, and a voltage follower including a level shift due to a potential difference between the gate-source paths of the transistors 161 and 162. The third source follower is arranged in a negative feedback path of the voltage follower constituted by the operational amplifier 160, the transistors 161 and 162, and the current source 166. Similar to the first sample-and-hold circuit, the output impedances of the second and third source followers are set to be equal to each other, thus realizing a sample-and-hold circuit with less error. In addition, a DC offset caused by the first and second source followers is compensated at an output terminal 163 by a level shift caused by the transistors 161 and 162. The difference in characteristics between the circuits 164 and 165 can be reduced to matching precision of each transistor by performing matching of the transistors 148 and 161 and of the transistors 154 and 162.

Figure 39:
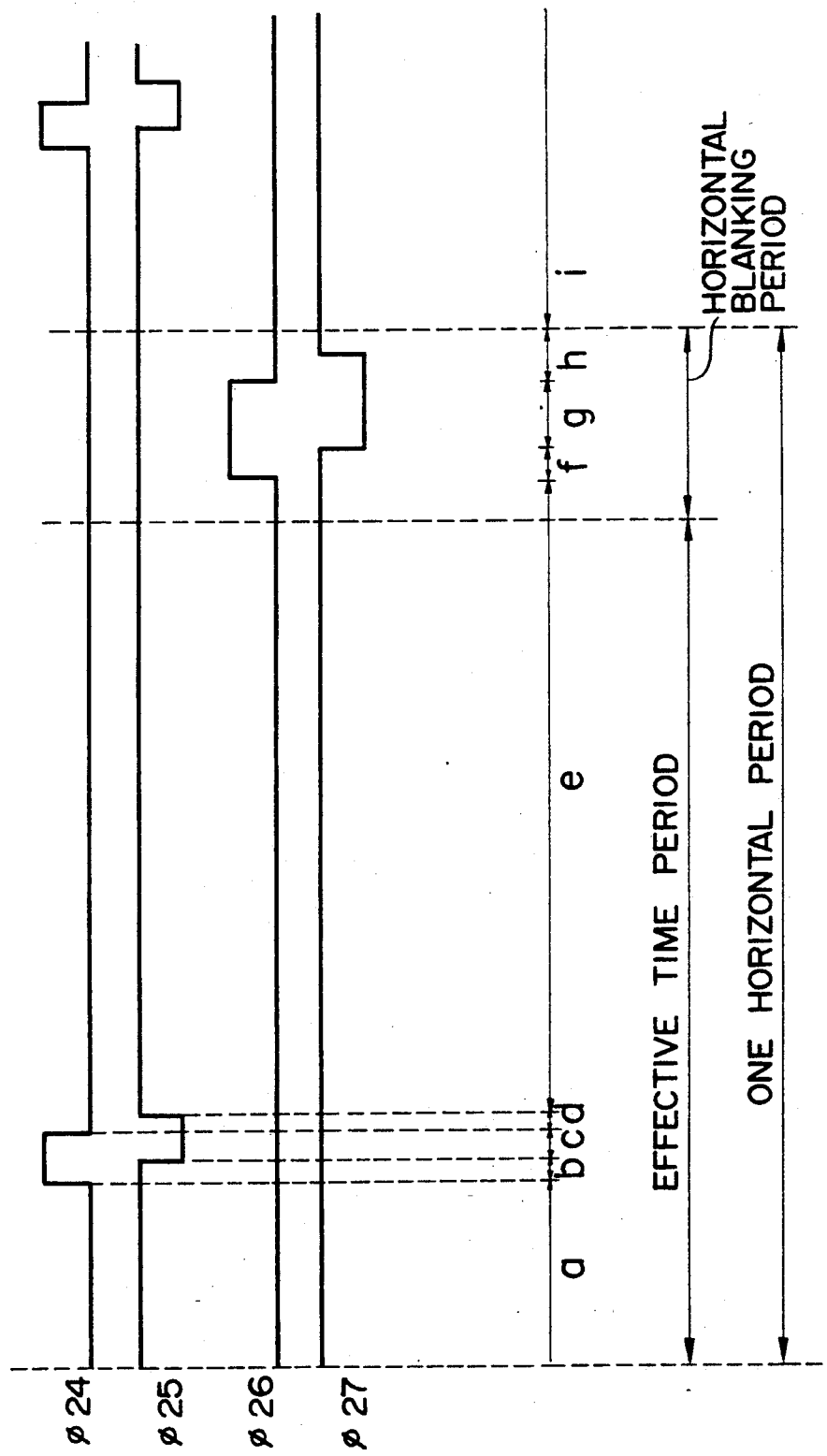
FIG. 39 is a timing chart of control signals used for the sample-and-hold circuit device in FIG. 38.

As indicated by a control signal timing chart in FIG. 39, the potential of image data is sampled and held in an effective time interval within one horizontal period of the image by the first sample-and-hold circuit in response to control signals $\phi 24$ and $\phi 25$. Subsequently, in a horizontal blanking period, a potential held by the first sample-and-hold circuit is sampled and held by the second sample-and-hold circuit in response to control signals $\phi 26$ and $\phi 27$. With this operation, the second sample-and-hold circuit can hold the potential for one horizontal interval before the next sample operation.

Figure 40:
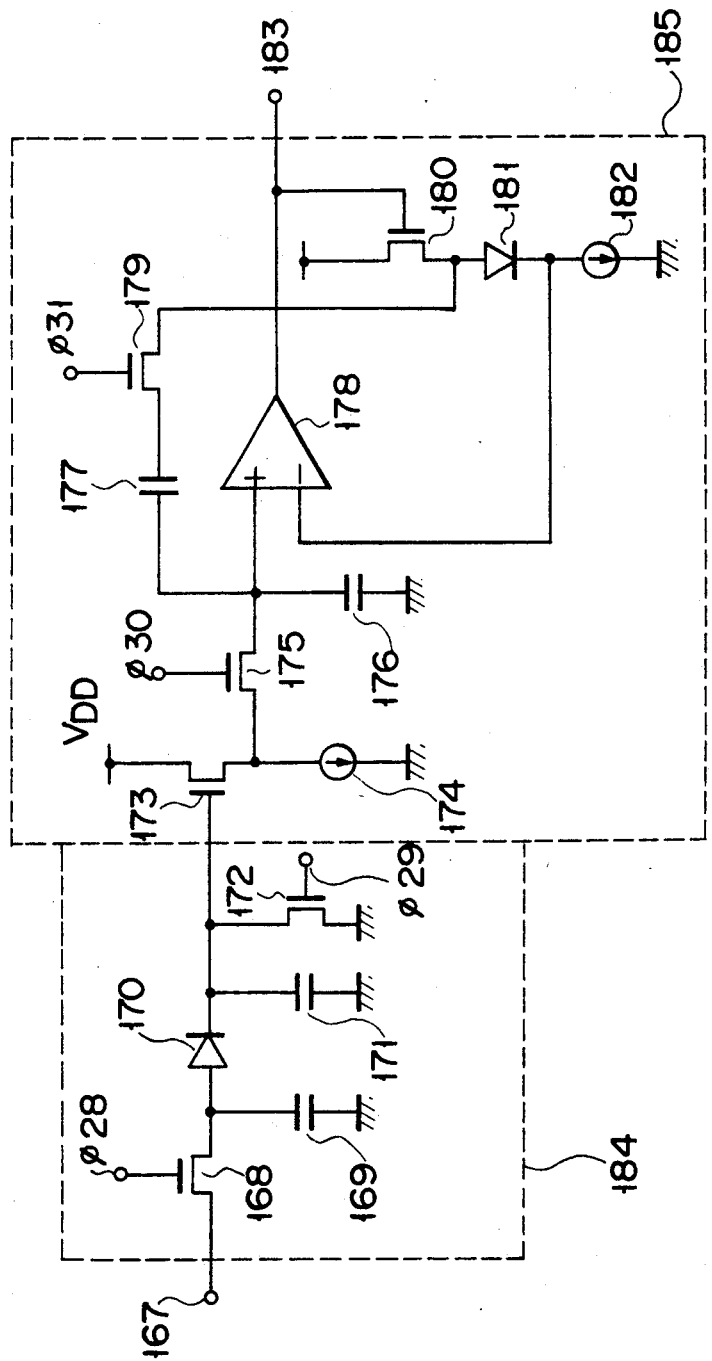
FIG. 40 is a circuit diagram showing a sample-and-hold circuit device for outputting a sampled/held value for one horizontal sampling period according to still another embodiment of the present invention.
Figure 41:
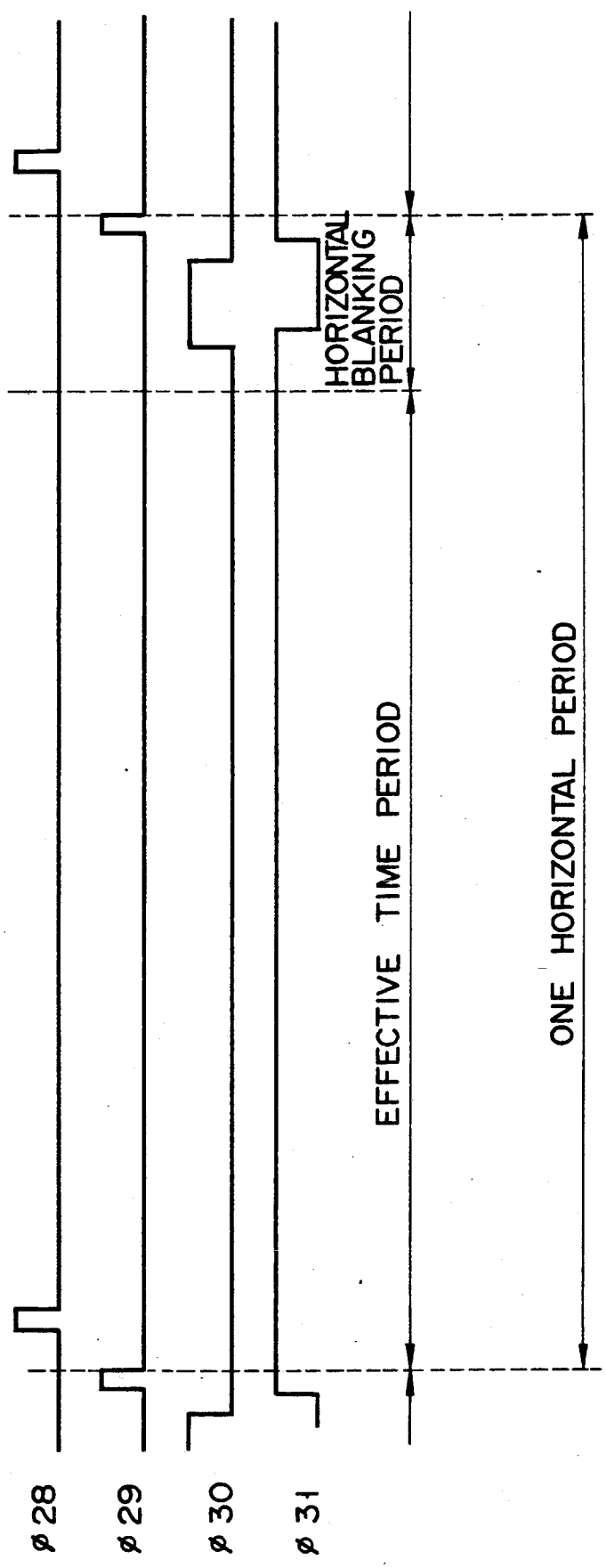
FIG. 41 is a timing chart of control signals used for the sample-and-hold circuit device in FIG. 40.

FIG. 40 shows still another embodiment. FIG. 41 is a timing chart of control signals. Referring to FIG. 40, first and second sample-and-hold circuits 184 and 185 are connected in series with each other. The first sample-and-hold circuit 184 is identical to the circuit described with reference to FIG. 15. The second sample-and-hold circuit 185 is identical to the second sample-and-hold circuit in FIG. 38 except that a diode 181 matched with a diode 170 used in the first sample-and-hold circuit 184 is used to perform a level shift in place of the MOS transistor 162. A further reduction in error in the second sample-and-hold circuit 185 is achieved by setting the output impedances of a source follower, constituted by a transistor 173 and a current source 174, and of a source follower, constituted by a transistor 180 and a current source 182, to be equal to each other. By matching the transistors 173 and 180 and the diodes 170 and 181, a forward voltage drop of the diode caused in the first sample-and-hold circuit, and a DC offset caused by a potential difference in the gate-source path of the source follower constituted by the transistor 173 and the current source 174 of the second sample-and-hold circuit 185 are compensated. In addition, the difference in characteristics between the circuits 184 and 185 can be reduced to matching precision between the transistors 173 and 180 and between the diodes 170 and 181.

As indicated by the timing chart of control signals in FIG. 41, in this circuit device, the potential of image data, sampled and held in an effective time interval within a horizontal period of a frame by the first sample-and-hold circuit in response to a control signal $\phi 28$, is sampled and held in the next horizontal blanking period by the second sample-and-hold circuit 185 in response to control signals $\phi 30$ and $\phi 31$. Subsequently, the image data is output in one horizontal period. A control signal $\phi 29$ is used to initialize a sample-and-hold circuit by causing the capacitor 171 of the first sample-and-hold circuit to discharge in a horizontal blanking period.

Figure 42:
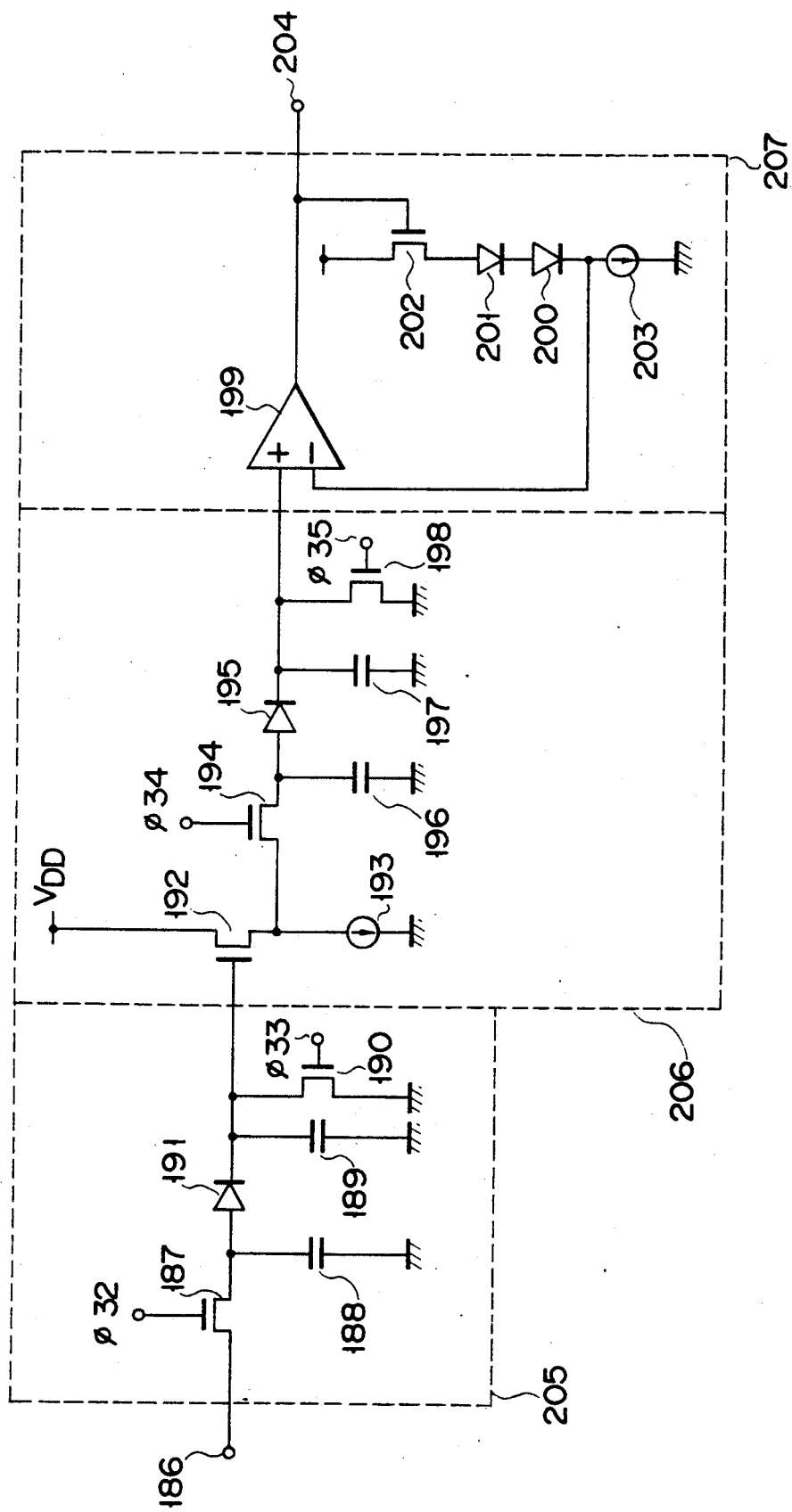
FIG. 42 is a circuit diagram showing a sample-and-hold circuit device for outputting a sampled/held value for one horizontal period according to still another embodiment of the present invention.
Figure 43:
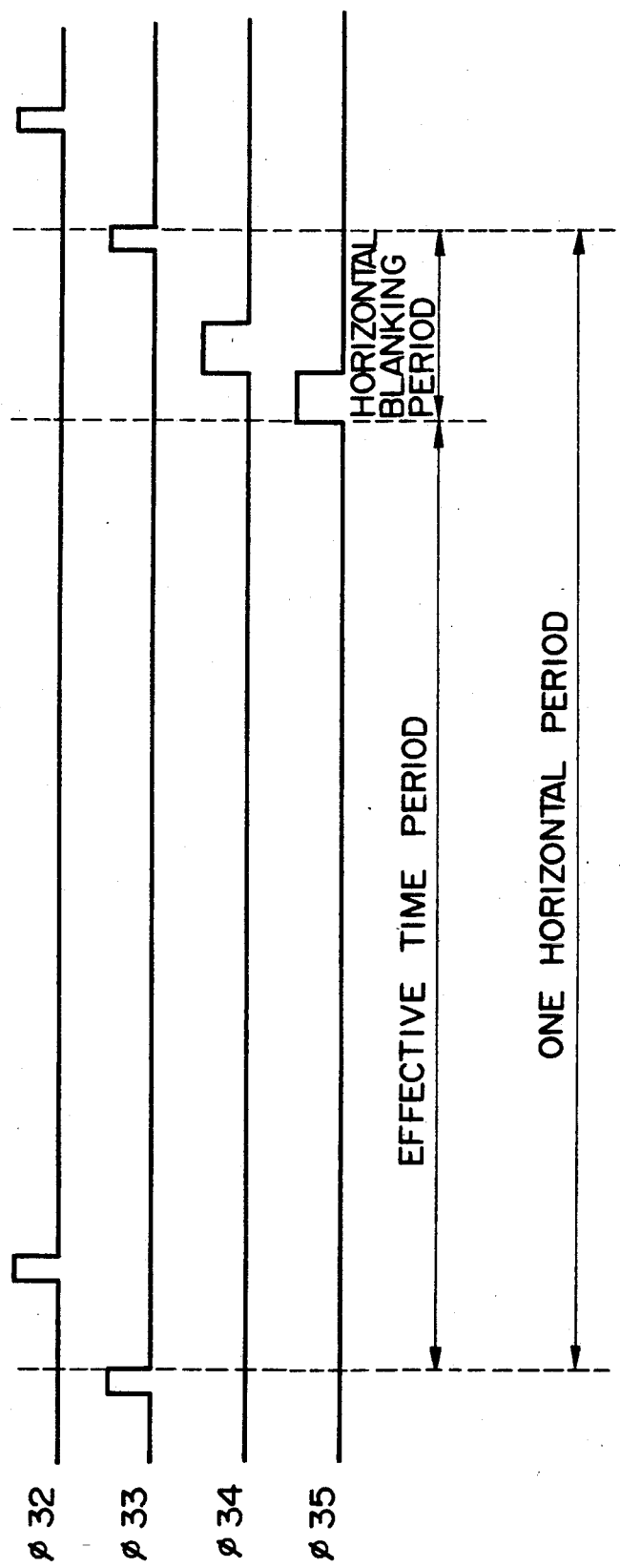
FIG. 43 is a timing chart of control signals used for the sample-and-hold circuit device.

FIG. 42 shows still another embodiment. FIG. 43 is a timing chart of control signals $\phi 32$ to $\phi 35$. Referring to FIG. 42, a first sample-and-hold circuit 205, a second sample-and-hold circuit device 206, and a DC offset compensating circuit 207 are connected in series with each other. The first sample-and-hold circuit 205 has the same circuit arrangement as that described with reference to FIG. 15. The second sample-and-hold circuit 206 has a circuit arrangement obtained by adding a source follower, constituted by a MOS transistor 192 and a current source 193, to the circuit shown in FIG. 15. The offset compensating circuit 207 is identical to the offset compensating circuit described with reference to FIG. 30 and is used to compensate for a forward voltage drop of a diode 191, generated in the first sample-and-hold circuit 105, a potential difference in the gate-source path of the transistor 192, generated in the second sample-and-hold circuit 206, and a forward voltage drop of a diode 195. In this case, the difference in characteristics among the circuits 205, 206 and 207 can be reduced to matching precision between the diode 191 and a diode 201, between the diode 195 and a diode 200, and between the transistor 192 and a transistor 202.

As indicated by the timing chart of control signals in FIG. 43, in the circuit device shown in FIG. 42, the potential of image data, sampled and held in an effective time interval within a horizontal period of a screen by the first sample-and-hod circuit 205 in response to a control signal $\phi 32$, is sampled and held in the next horizontal blanking period by the second sample-and-hold circuit 206 in response to control signals $\phi 34$ and $\phi 35$. Subsequently, the image is output in the next one horizontal period. A control signal $\phi 33$ is used to initialize a sample-and-hold circuit by causing a capacitor 189 of the first sample-and-hold circuit to discharge in a horizontal blanking period.

A second means for solving the first and second problems will be described below.

A sample-and-hold circuit device according to the second means comprises first and second sample-and-hold circuits for receiving an input signal, a first buffer for receiving an output from the first sample-and-hold circuit, a second buffer for receiving an output from a second sample-and-hold circuit, a first switch having an internal terminal connected to the output terminal of the first buffer and ON/OFF-operated by a first control signal, a second switch having an internal terminal connected to the output terminal of the second buffer and ON/OFF-operated by a second control signal, and a third buffer having an internal terminal as an input terminal.

According to the above-described sample-and-hold circuit device, the first and second sample-and-hold circuits are alternately operated in units of horizontal intervals to repeat sampling and outputting operations in the following manner. A potential sampled by the first sample-and-hold circuit in an effective time interval within an Nth horizontal period of an image is output through the first and third buffers by turning on the first switch using the first control signal and turning off the second switch using the second control signal in an (N+1)th horizontal period. Subsequently, a potential sampled in an (N+1)th horizontal period is output through the second and third buffers by turning on the second switch using the second control signal and turning off the first switch using the first control signal.

The above-described sample-and-hold circuit device will be described in detail below with reference to FIG. 44.

Figure 44:
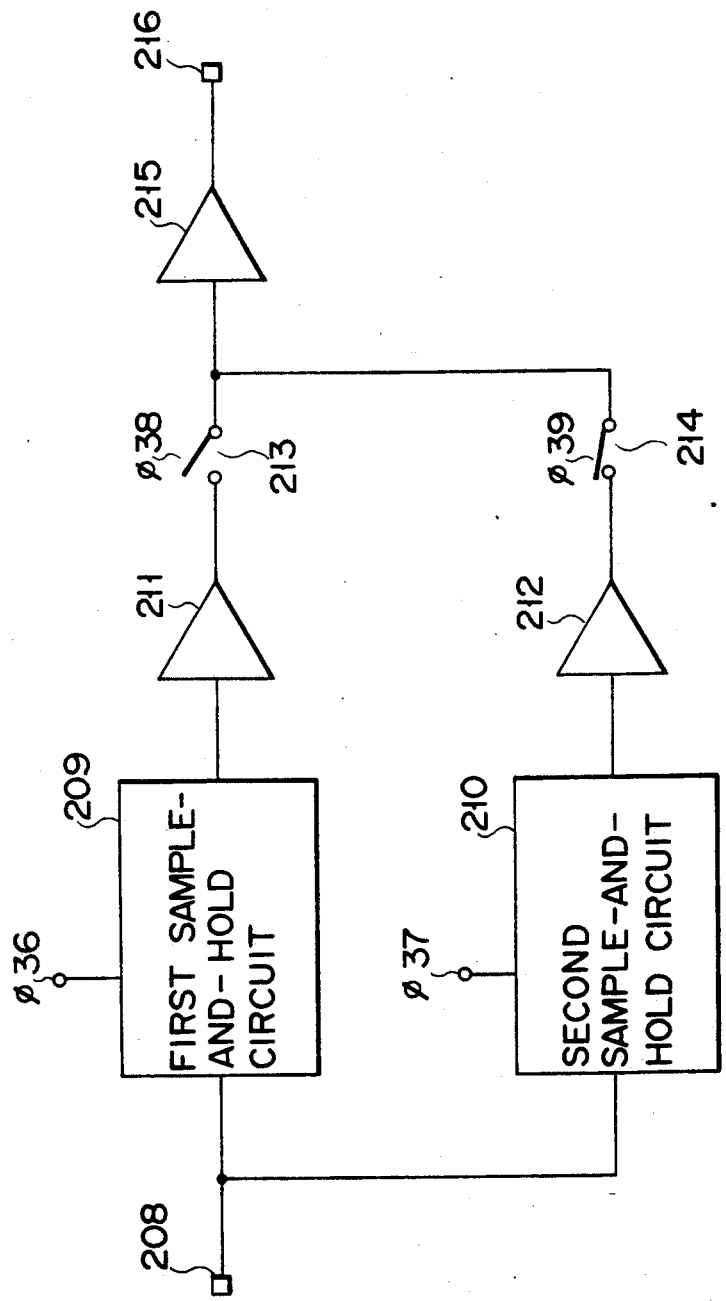
FIG. 44 is a circuit diagram showing a sample-and-hold circuit device for outputting a sampled/held value for one horizontal period according to still another embodiment of the present invention.

In the circuit device shown in FIG. 44, an input terminal 208 is connected to the input terminals of the first and second sample-and-hold circuits 209 and 210. The output terminals of the first and second sample-and-hold circuits 209 and 210 are respectively connected to first and second switches 213 and 214 through first an second buffers 211 and 212. The output contacts of the first and second switches 213 and 214 are connected to an output terminal 216 through a third buffer 215.

Figure 45:
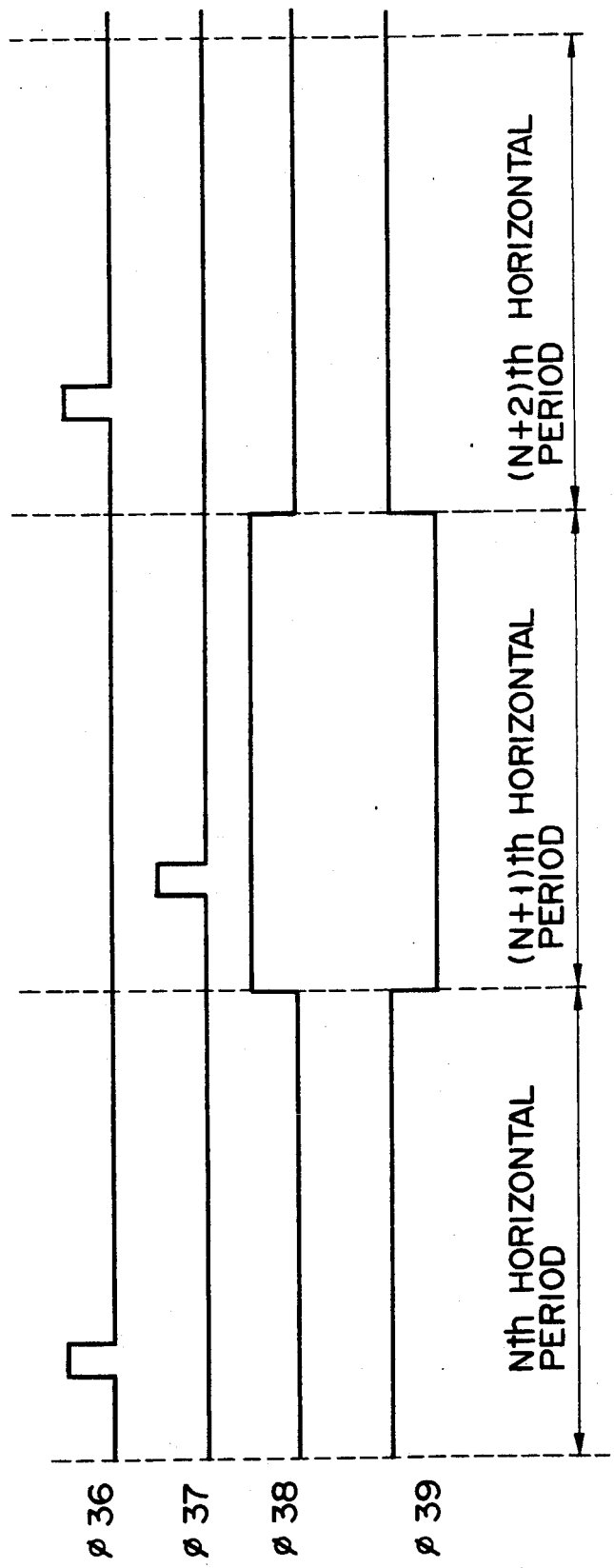
FIG. 45 is a timing chart of control signals used for the sample-and-hold circuit device in FIG. 44.

An operation of the circuit shown in FIG. 44 will be described below with reference to a timing chart in FIG. 45.

A signal input from the input terminal 208 is sampled in the Nth horizontal interval by the first sample-and-hold circuit 209 in response to a control signal $\phi 36$. At this time, the first switch 213 is set in an OFF state by control signals $\phi 38$ and $\phi 39$. In addition, in response to a control signal $\phi 37$, the second sample-and-hold circuit 210 holds a potential sampled in an (N−1)th horizontal period. This potential is output through the second buffer 212, the second switch 214, and the third buffer 215 in the Nth horizontal period. In an (N+1)th horizontal period, the first switch is turned on by the control signal $\phi 38$, and the second switch is OFF by the control signal $\phi 39$. At this time, in response to the control signal $\phi 36$, the first sample-and-hold circuit holds the potential sampled in the Nth horizontal period. This potential is output in the (N+1)th horizontal period through the first buffer 211, the first switch 213, and the third buffer 215. In response to the control signal $\phi 37$, the second sample-and-hold circuit samples an input signal. Therefore, the first and second sample-and-hold circuits are alternately operated in units of horizontal periods to repeat sampling and outputting operations.

Even if the switches 213 and 214 are realized by analog switches constituted by MOS transistors, since either of the switches 213 and 214 is turned on and is driven by an output from the buffer 211 or 212, error charges such as channel charges generated upon an ON/OFF operation of the switches 213 and 214 are absorbed by the buffers to prevent the error charges from appearing at the output terminal, thus driving the output terminal 216 in one horizontal interval without increasing errors or difference in characteristics.

The embodiment shown in FIG. 44 will be described in more detail below with reference to a circuit in FIG. 46 and a timing chart in FIG. 47.

Figure 46:
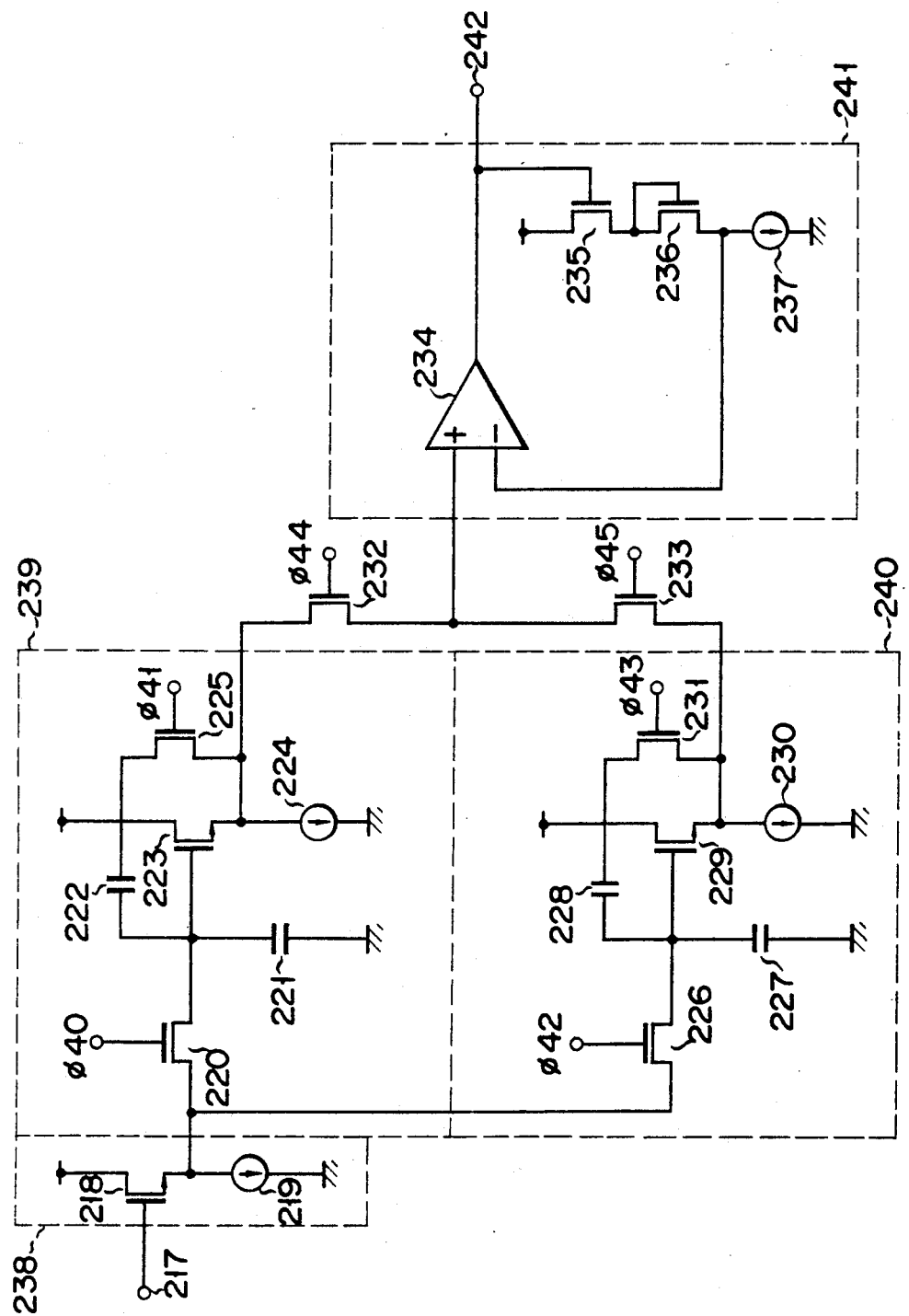
FIG. 46 is a circuit diagram showing a sample-and-hold circuit device for outputting a sampled/held value for one horizontal period according to still another object of the present invention.

Referring to FIG. 46, the output terminal of a source follower 238 constituted by a MOS transistor 218 and a current source 219 is connected to sample-and-hold circuits 239 and 240. The sample-and-hold circuits 239 and 240 are respectively connected to switches constituted by MOS transistors 232 and 233. These switches are connected to a voltage follower 241 including a source follower consisting of transistors 235 and 236 and a current source 237 in a negative feedback path. The output terminal of the voltage follower 241 is connected to an output terminal 242.

The sample-and-hold circuits 239 and 240 are designed to include buffers formed of source followers constituted by a MOS transistor 223 and a current source 224, and a MOS transistor 229 and a current source 230 respectively, and hence also serve as the buffers 211 and 212 shown in FIG. 44. In such a circuit, errors can be reduced by setting the output impedance of the source follower 238 to be equal to that of the source follower included in each of the sample-and-hold circuits 239 and 240. By additionally arranging a level shift circuit constituted by MOS transistors 235 and 236 and a current source 237 in the negative feedback path in the voltage follower used as the output buffer 241, the voltage follower also serves to perform DC offset compensation of potential differences between the gate-source paths of the source followers 238, and the sample-and-hold circuits 239 and 240. Therefore, difference in output characteristics can be reduced to the above-mentioned matching precision by performing matching between the transistors 218, 223, 229, 235, and 236 constituting the source followers and the level shift circuits an the current sources 219, 224, 230 and 237 in FIG. 46. The overall circuit is operated in the same manner as described with reference to FIG. 44. Error charges such as channel charges generated upon ON/OFF operations of the switches 232 and 233 are absorbed by the source followers included in the sample-and-hold circuits 239 and 240 to prevent the error charges from appearing at the output terminal, thereby driving the output terminal in one horizontal period without increasing errors and difference in characteristics.

Figure 48:
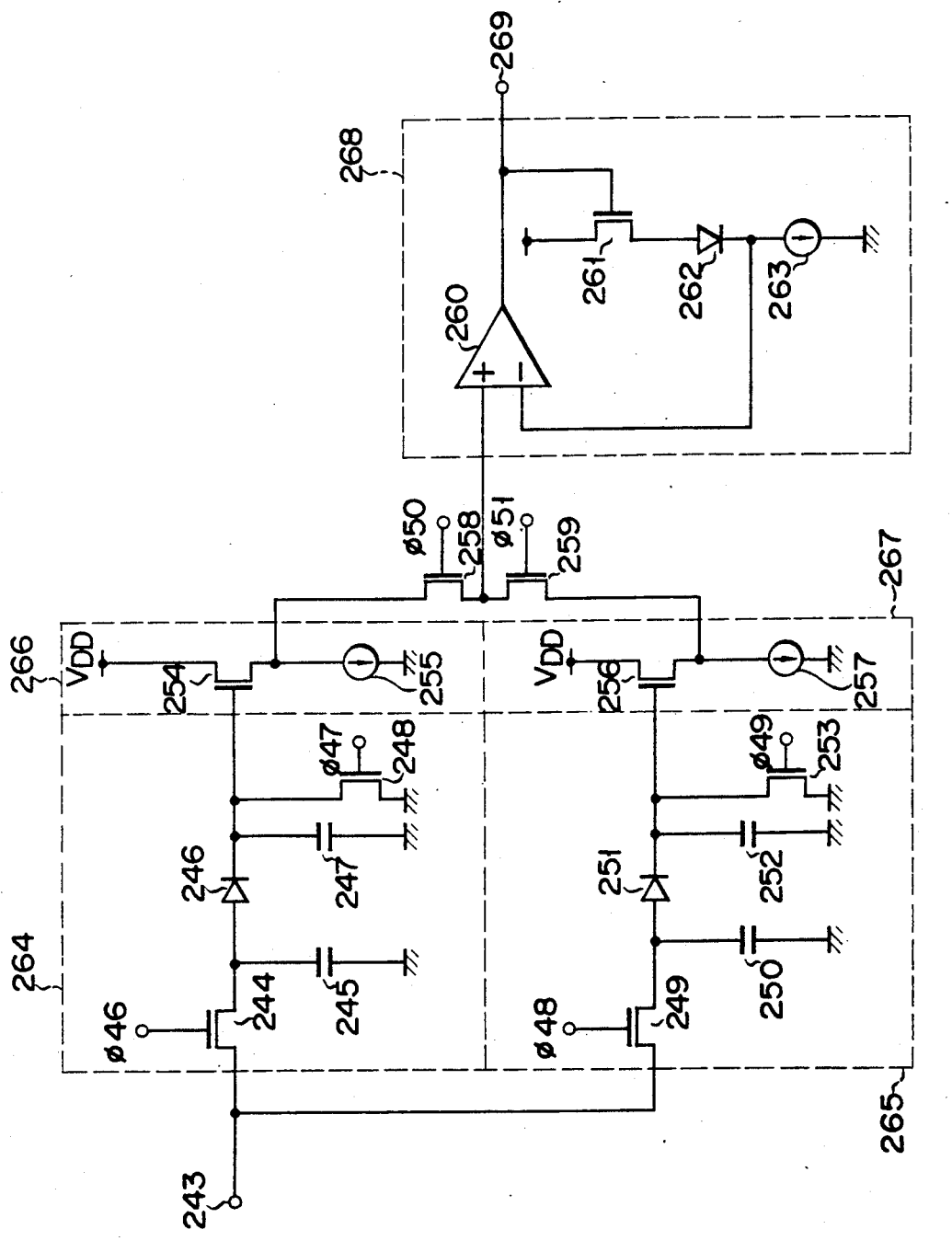
FIG. 48 is a circuit diagram showing a sample-and-hold circuit device for outputting sampled/held value for one horizontal period according to still another embodiment of the present invention.
Figure 49:
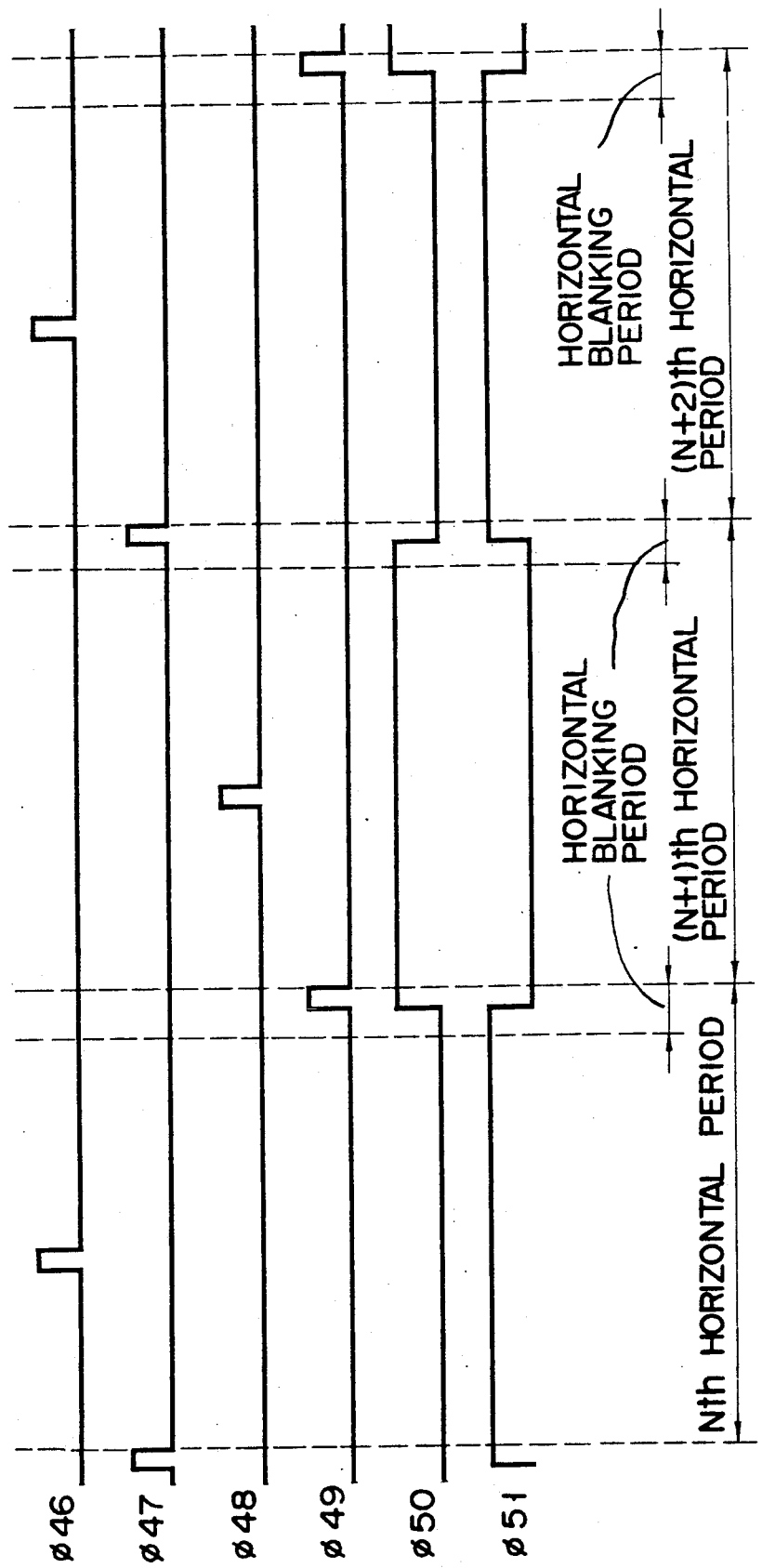
FIG. 49 is a timing chart of control signals used for the sample-and-hold circuit device in FIG. 48.

FIG. 48 shows a circuit wherein the first and second sample-and-hold circuits 209 and 210 in FIG. 44 are realized by the circuit described with reference to FIG. 15, and the first and second buffers 211 and 212 are respectively realized by source followers 266 and 267. The source followers 266 and 267 are connected to an output buffer 268 through switches 258 and 259. In this circuit, circuit elements 244 to 248 respectively correspond to the circuit elements 55, 91, 56, and 58 in FIG. 15. Similarly, circuit elements 249 to 253 respectively correspond to the circuit elements 55, 91, 56, and 58 in FIG. 15. In addition, circuit elements 260 to 263 respectively correspond to the circuit elements 102 and 105 in FIG. 30. FIG. 49 shows control signals $\phi 46$ to $\phi 51$ to be input to the circuit in FIG. 48. The output buffer 268 of the circuit in FIG. 48 also serves as a level shift circuit and hence compensates for a DC offset due to a forward voltage drop of a diode, generated in each of the first and second sample-and-hold circuits 264 and 265, and a DC offset due to a voltage drop in the gate-source path of each of the source followers 266 and 267, as in the embodiment of FIG. 30, for compensating for a DC offset. Output variations can be reduced to the above-mentioned matching precision by performing matching between diodes 246, 251, and 262 and between transistors 254, 256, and 261 in FIG. 48.

A first means for solving the third problem will be described below.

According to the first means, a circuit device comprises sample-and-hold circuits having control terminals capable of controlling DC components of first to (N+1)th (N $\geq$ 1) outputs in which (N+1)th sample-and-hold circuit receives an arbitrary reference potential, and a comparator/amplifier for comparing an output from an (N+1)th sample-and-hold circuit with the reference potential. An output from the comparator/amplifier is fed back to the DC component control terminals of the first to (N+1)th sample-and-hold circuits.

With the above-described circuit arrangement, a difference between an input reference potential and the reference potential sampled and held by the (N+1)th sample-and-hold circuit, is amplified by the comparator/amplifier so as to detect an amplified DC offset component included in each sample-and-hold circuit. The amplified DC offset component is then fed back to the DC component control terminals of the first to (N+1)th sample-and-hold circuits so as to set the amplified DC offset component to be 1/(gain of comparator-/amplifier). With this operation, not only the DC offset component of the (N+1)th sample-and-hold circuit but also the DC offset component of each of the first to the Nth sample-and-hold circuits are reduced to 1/(gain of comparator/amplifier).

The sample-and-hold circuit device for solving the third problem will be described below with reference to FIG. 50.

Figure 50:
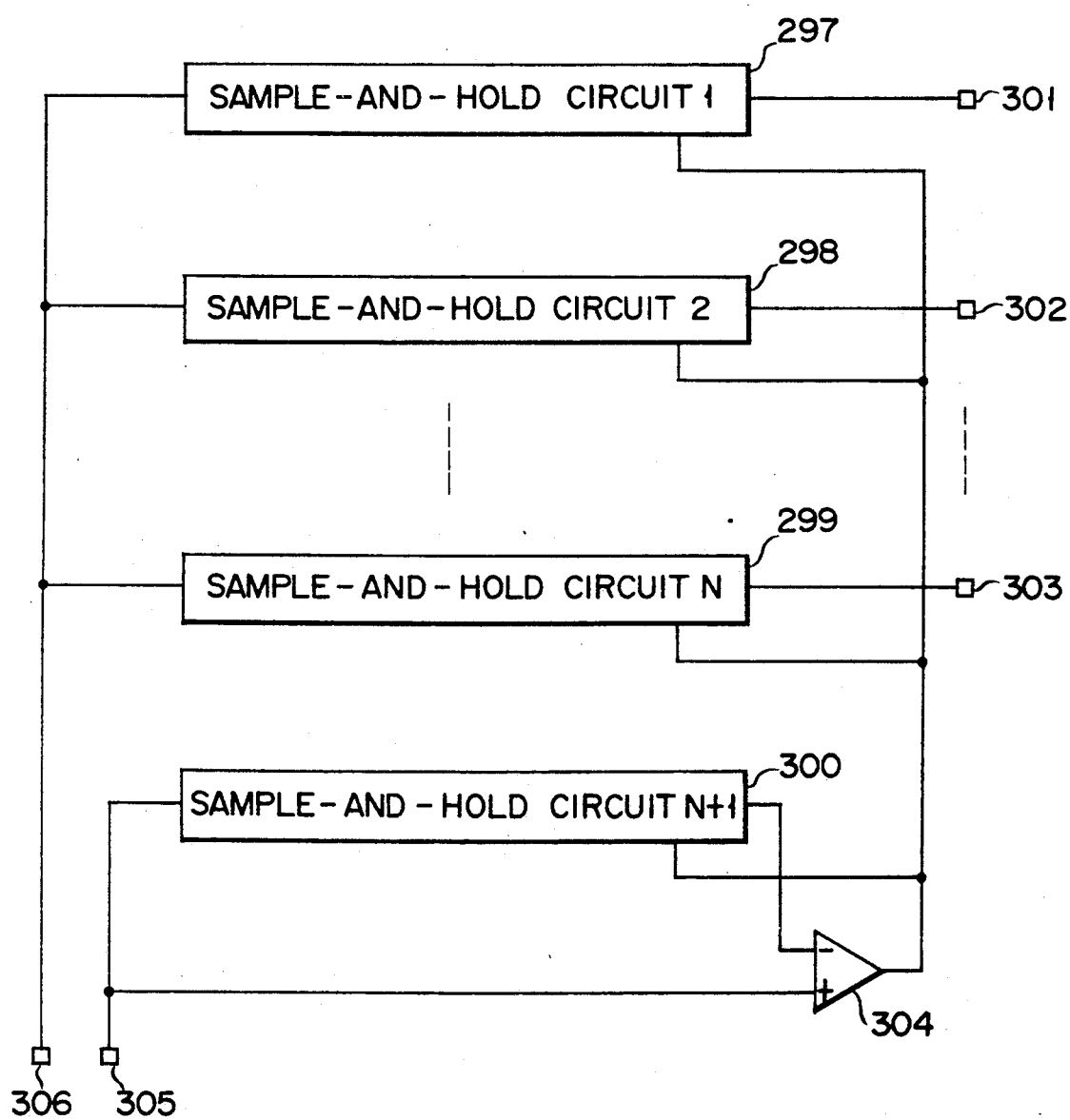
FIG. 50 is a circuit diagram showing a DC offset compensation circuit between ICs.

FIG. 51 shows a detailed arrangement of each of first to (N+1)th sample-and-hold circuits 297 to 300 shown in FIG. 50. In this sample-and-hold circuit, the current source 263 constituting the source follower included in the negative feedback path of the voltage follower as an output buffer 268 shown in FIG. 48 is realized by a current source constituted by a transistor 290 connected in parallel with a current source 300 and having a control terminal 291. In this circuit, a current is controlled by control signals applied to the control terminal 291 to control a potential difference in the gate-source path of a transistor 288 and a forward voltage drop in a diode 289, thereby controlling output DC components. In addition, in this sample-and-hold circuit, DC offset compensation can be performed by controlling a gate 291 of a transistor connected in parallel with a current source 284 of a source follower 294, as shown in FIG. 52.

According to the circuit in FIG. 50, an input terminal 306 is connected to the input terminals of the first to Nth sample-and-hold circuits 297 to 299. A reference potential input terminal 305 is connected to the input terminal of the (n+1)th sample-and-hold circuit 300. The output terminals of the first to Nth sample-and-hold circuits 297 to 299 are respectively connected to output terminals 301 to 303. The output terminal of the N+1)th sample-and-hold circuit 300 is connected to an operational amplifier 304.

The N+1)th sample-and-hold circuit 300 samples and holds a reference potential input from the input terminal 305. An output from the (N+1)th sample-and-hold circuit 300 is compared with the reference potential by the operational amplifier 304. The obtained DC offset component is then detected and amplified. An output from the operational amplifier 304 is supplied to the output DC component control terminals of the first to (N+1)th sample-and-hold circuits 297 to 300, and the DC offset component is controlled to be 1/(gain of operational amplifier 304). At this time, the DC offset components in the first to Nth sample-and-hold circuits 297 to 299 are compensated in the same manner as described above. Even if a plurality of ICs each incorporating a large number of sample-and-hold circuits are used as a means for driving a liquid crystal display, a deterioration in picture quality due to output variations between the ICs for driving the display, which poses a problem in the conventional device, can be prevented by compensating for DC offset in each IC.

A sample-and-hold circuit device as a second means for solving the third problem will be described below.

This sample-and-hold circuit device comprises N (N ≧ 1) sample-and-hold circuits each having a control terminal capable of controlling an output DC component, an averaging circuit for averaging outputs from the N sample-and-hold circuits, a comparator/amplifier for comparing an average value with a reference potential, and a holding circuit for holding an output from the comparator/amplifier. An output from the holding circuit is fed back to the control terminals of the N sample-and-hold circuits.

An arbitrary reference potential is applied to all the N sample-and-hold circuits in a period, e.g., a vertical blanking period. An average value of outputs from the N sample-and-hold circuits is obtained by the averaging circuit. A difference between the average value and the reference potential is amplified by the comparator/amplifier to detect a DC offset component. The amplified DC offset component is then fed back to the output DC component control terminals of the N sample-and-hold circuits so as to reduce the amplified DC offset component to 1/(gain of comparator/amplifier). In a normal operation time interval other than a vertical blanking period, the amplified DC offset component is held, and the DC offset component is kept to be 1/(gain of comparator/amplifier).

The sample-and-hold circuit device for solving the third problem will be described in detail below with reference to FIG. 53.

Figure 53:
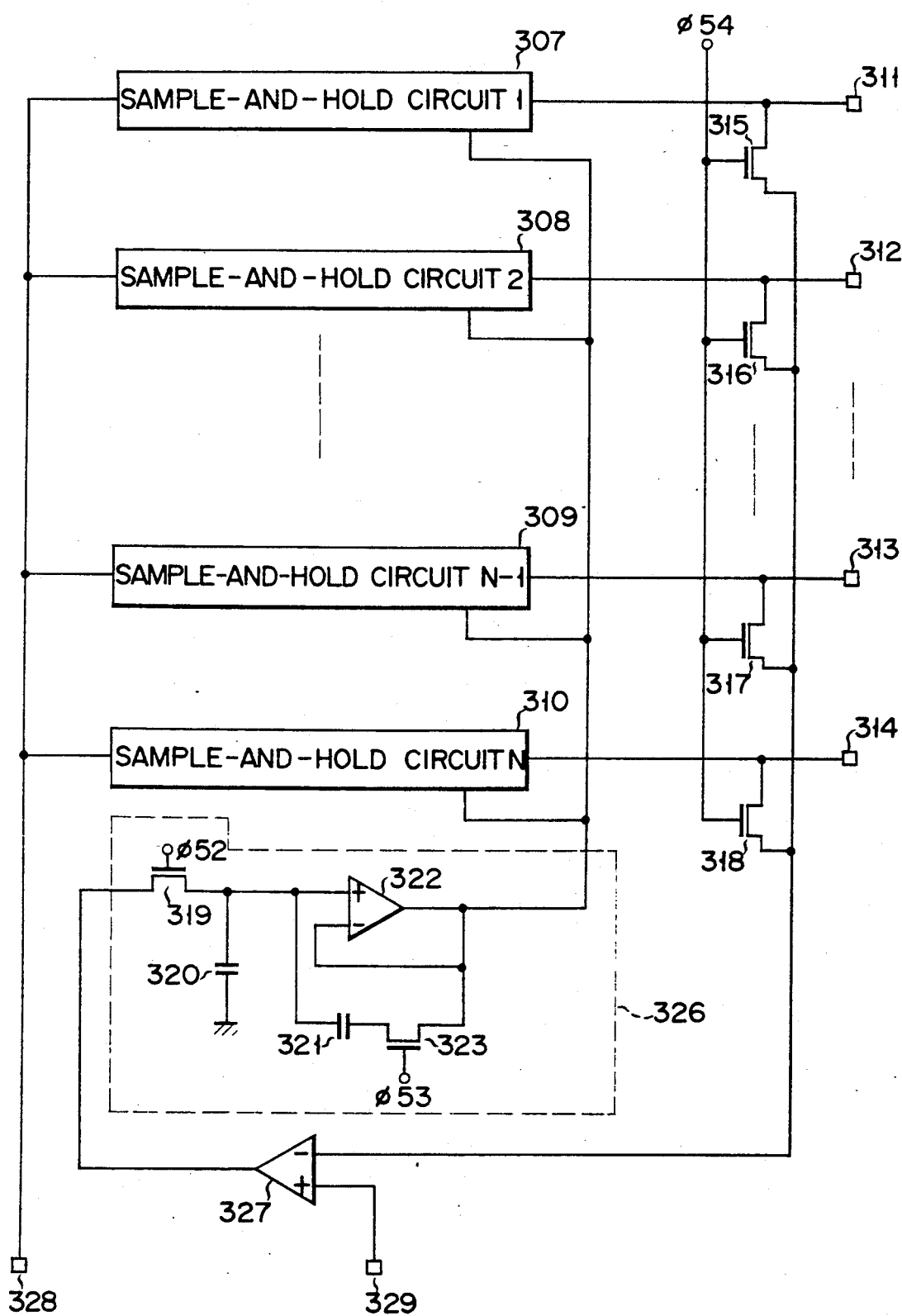
FIG. 53 is a circuit diagram showing another DC offset compensation circuit between ICs.

According to the circuit shown in FIG. 53, an input terminal 328 is connected to first to Nth sample-and-hold circuits 307 to 310 each having the same arrangement as that shown in, e.g., FIG. 51 or 52. The output terminals of the sample-and-hold circuits 307 to 310 are respectively connected to MOS transistors 315 to 318 constituting analog switches. These switches 315 to 318 are operated by a control signal $\phi 54$ and constitute an averaging circuit for averaging outputs from the sample-and-hold circuits. The averaging circuit outputs an average output to output terminals 311 to 314 of the N sample-and-hold circuits. An operational amplifier 327 obtains a difference between a reference potential input from a reference potential input terminal 329 and the output from the averaging circuit, and amplifies the difference. An output from the operational amplifier 327 is supplied to a sample-and-hold circuit 326 which performs a sampling/holding operation in a vertical blanking period. An output from the sample-and-hold circuit 326 is fed back to the output DC component control terminals of the first to Nth sample-and-hold circuits.

An operation of the sample-and-hold circuit 326 will be described below with reference to timing charts in FIGS. 54A and 54B.

In a vertical blanking period, a potential equal to a reference potential to be applied to the input terminal 329 is applied to the input terminal 328. The first to Nth sample-and-hold circuits 307 to 310 are operated in accordance with a timing chart shown in FIG. 49. Reference potentials sampled and held by the respective sample-and-hold circuits are output from the output terminals 311 to 314. In the vertical blanking period, the MOS transistors 315 to 318 are turned on by the control signal $\phi 54$, and hence the negative input terminal of the operational amplifier 327 is set to an average value of the reference potentials sampled and held by the first to Nth sample-and-hold circuits 307 to 310. A feedback operation is performed to reduce a difference between the average value of the sampled/held reference potentials and the reference potential, i.e., a DC offset component to 1/(gain of operational amplifier) in a sampling period. Since an output from the operational amplifier 327 is held by the sample-and hold circuit 326 in time intervals other than a vertical blanking period, a DC offset component can be reduced to 1/(gain of operational amplifier) even in a normal sample and-hold operation period in an image signal time interval other than a vertical blanking period. Therefore, even if a plurality of ICs each incorporating a large number of sample-and-hold circuits are used as a means for driving a liquid crystal display, a deterioration in picture quality due to output variations between the ICs can be prevented by compensating for a DC offset component in each IC.

In the embodiment shown in FIG. 53, the DC offset amplified by the operational amplifier 237 is held by the sample-and-hold circuit 326 in an image signal time interval other than a vertical blanking period. As shown in FIG. 55, however, an average value of reference potentials sampled and held by first to Nth sample-and-hold circuits 330 to 333 may be held by a sample-and-hold circuit 352 in an image signal time interval other than a vertical blanking period. An amplified difference between the average value and a reference potential may be then obtained by an operational amplifier 342 and may be fed back to the output DC component control terminals of the first to Nth sample-and-hold circuits 307 to 310.

Figure 56:
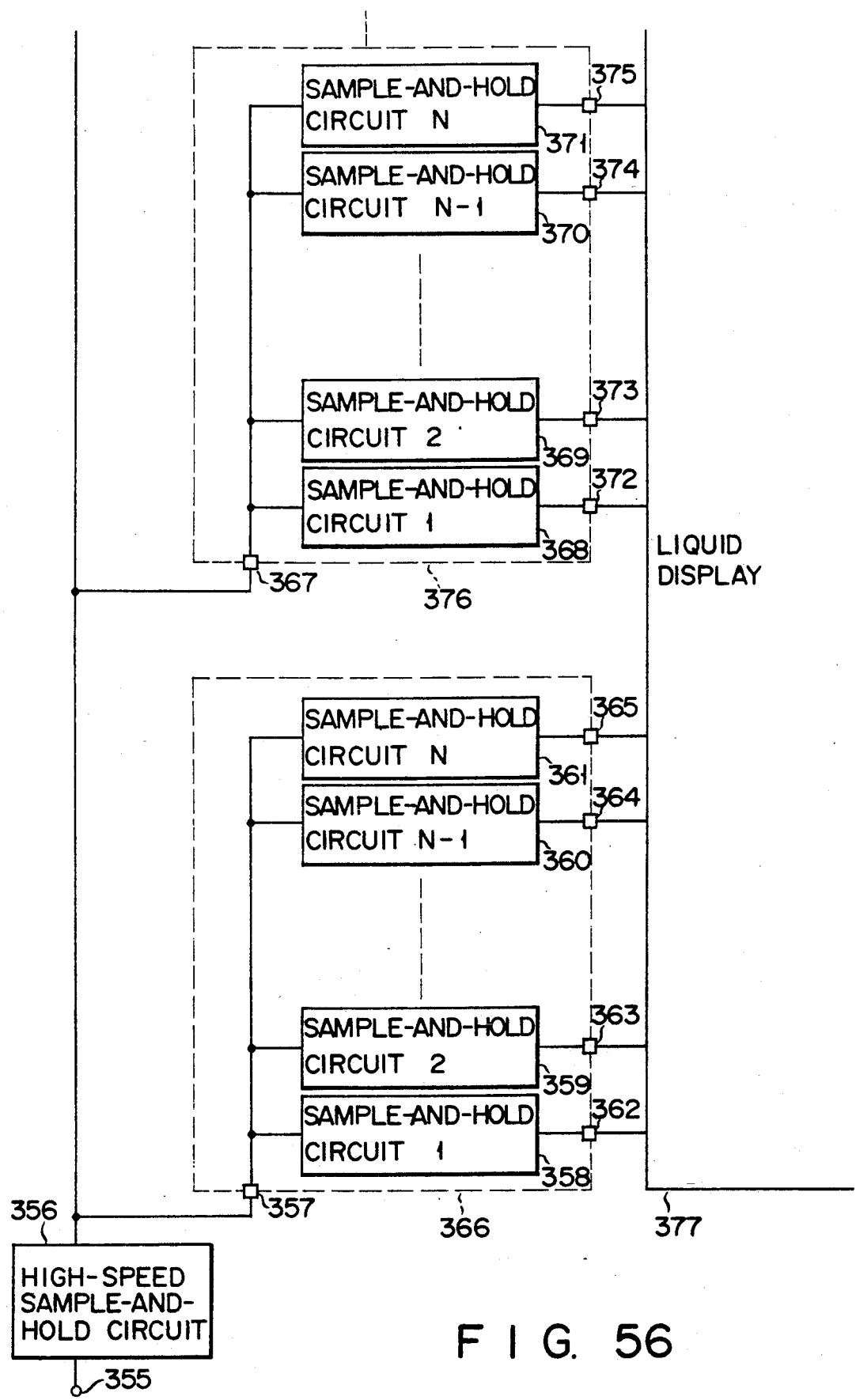
FIG. 56 is a circuit diagram showing a circuit device for preventing the influences of jitter of control signals used for the sample-and-hold circuit.

FIG. 56 shows a case wherein a plurality of driving ICs 366 and 376 respectively including a plurality of sample-and-hold circuits 358 to 361 and 368 to 371 are used to drive a liquid crystal display. A liquid crystal display 377 is connected to the driving ICs 366 and 376 respectively including the plurality of sample-and-hold circuits 358 to 361 and 368 to 371. The driving ICs 366 and 376 are connected to a high-speed sample-and-hold circuit 356.

If jitter is included in a control signal for operating the sample-and-hold circuits of each drawing IC as shown in FIG. 57A, fluctuations are caused at a sampling point, resulting in noise on a screen. By arranging the high-speed sample-and-hod circuit 356 is connected to the input terminal of each driving IC as shown in FIG. 56, the influences of jitter components of control signals for operating the sample-and-hold circuits of the driving ICs 366 and 376 can be suppressed, as shown in FIG. 57B. In the embodiments described with reference to FIGS. 1, 5, and 6, since peak values of control signals in pulse intervals are detected and held, such peak values are equivalently regarded as jitter components of control signals in addition to the above-mentioned jitter components of the control signals. Such jitter components can also be prevented by the embodiment shown in FIG. 56. In addition, sampling operations of the high-speed sample-and-hold circuit 356 and of the sample-and-hold circuit groups of the driving ICs 366 and 377 can be performed in synchronism with each other. With this, since the sample-and-hold circuit groups of the driving ICs 366 and 376 are driven after the high-speed sample-and-hold circuit 356 is changed from a transient state to a normal state, conversion precision can be improved. In addition, when a signal which underwent digital signal processing and D/A conversion as in a high definition TV or an extended definition TV scheme is to be input, since a D/A converter includes a hold function, the high-speed sample-and-hold circuit shown in FIG. 58 is not required, and an output from a D/A converter 378 may be used as an input to a driving IC. In this case, conversion precision can be improved by synchronizing the digital input timing of the D/A converter with the sampling timing of the sample-and-hold circuit groups of the driving ICs 366 and 377, and by driving the sample-and-hold circuit groups of the driving ICs 366 and 376 after the D/A converter 378 is changed from a transient state to a normal state.

Additional advantages and modifications will readily occur to those skilled in the art. Therefore, the invention in its broader aspects is not limited to the specific details, and representative devices, shown and described. Accordingly, various modifications may be made without departing from the spirit or scope of the general inventive concept as defined by the appended claims and their equivalents.

What is claimed is:

1. A sample-and-hole circuit device comprising:
    input signal terminal means for receiving an input signal;
    output terminal means;
    reference potential terminal means having a reference potential;
    a MOS transistor having an input connected to said input signal terminal means, an output, and a gate terminal supplied with a first control signal, said MOS transistor producing an error charge when it is turned off by the first control signal;
    a non-linear element having a first terminal connected to the output of said MOS transistor, and a second terminal connected to said output terminal means, said non-linear element being turned off by the error charge;
    potential holding means connected between the second terminal of said non-linear element and said output terminal means and said reference potential terminal means; and
    a switch means which is turned on or off by a second control signal so as to selectively connect said output terminal means to said reference potential terminal means.

2. A device according to claim 1, further comprising a third switch means which is turned on by the second control signal, for connecting said output of said MOS transistor and the first terminal of said non-linear element to said potential terminal means.

3. A device according to claim 1, further comprising second potential holding means connected between said output of said MOS transistor and the first terminal of said non-linear element and said reference potential terminal means.

4. A device according to claim 1, further comprising third switch means, turned on by a third control signal, for connecting said output of said MOS transistor and the first terminal of said non-linear element to said reference potential terminal means.

5. A sample-and-hold circuit device comprising:
    input terminal means for receiving an input signal;
    output terminal means;
    reference potential terminal having a reference potential;
    a MOS transistor having an input connected to said input signal terminal means, an output, and a gate terminal supplied with a first control signal, said MOS transistor producing an error charge when it is turned off by the first control signal;
    a non-linear element having a first terminal connected to the output of said MOS transistor, and a second terminal connected to said output terminal means, said non-linear element being turned off by the error charge;
    potential holding means connected between the second terminal of said non-linear element and said output terminal means and said reference potential terminal; and current source means which is controlled in response to a second control signal so as to connect said output terminal means to said reference potential terminal.

6. A sample-and-hold circuit device comprising:

first sample-and-hold means for sampling and holding an input signal; and second sample-and-hold means, having a high input impedance, for sampling and holding an output from said first sample-and-hold means, wherein said first sample-and-hold means comprises:

an input signal terminal for receiving the input signal;

an output terminal;

a reference potential terminal having a reference potential;

a MOS transistor having an input connected to said input signal terminal means, an output, and a gate terminal supplied with a first control signal, said MOS transistor producing an error charge when it is turned off by the first control signal;

a non-linear element having a first terminal connected to the output of said MOS transistor, and a second terminal connected to said output terminal, said non-linear element being turned off by the error charge;

potential holding means connected between the second terminal of said non-linear element an said output terminal and said reference potential terminal; and a switch means which is turned on by a second control signal to connect said output terminal to said reference potential terminal.

7. A sample-and-hold circuit device comprising:

first sample-and-hold means for sampling and holding an input signal; and second sample-and-hold means, having a high input impedance, for sampling and holding an output from said first sample-and-hold means, wherein said second sample-and-hold means comprises:

first buffer means for receiving, as an input signal, said output from said first sample-and-hold means;

a sample-and-hold circuit for sampling and holding an output from said first buffer means; and a voltage follower, having second buffer means and level shift means arranged in a negative feedback path of said voltage follower, wherein said sample-and-hold circuit of said second sample-and-hold means comprises:

an input signal terminal for receiving the input signal;

a MOS transistor having an input connected to said input signal terminal means, an output, and a gate terminal supplied with a first control signal, said MOS transistor producing an error charge when it is turned off by the first control signal;

a non-linear element having a first terminal connected to the output of said MOS transistor, and a second terminal connected to said output terminal, said non-linear element being turned off by the error charge;

potential holding means connected between the second terminal of said non-linear element and said output terminal and said reference potential terminal; and a switch means which is turned on by a second control signal to connect said output terminal to said reference potential terminal.

* * * * *